United States Patent
Shimizu

(10) Patent No.: US 8,558,576 B2
(45) Date of Patent: Oct. 15, 2013

(54) OUTPUT BUFFER

(75) Inventor: Yuui Shimizu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 13/040,762

(22) Filed: Mar. 4, 2011

(65) Prior Publication Data

US 2011/0215836 A1    Sep. 8, 2011

(30) Foreign Application Priority Data

Mar. 4, 2010    (JP) ................................ 2010-047858

(51) Int. Cl.
*H03K 19/094*    (2006.01)
*H03B 1/00*    (2006.01)

(52) U.S. Cl.
USPC ............... 326/83; 326/87; 327/108; 327/109

(58) Field of Classification Search
USPC ............................ 326/82–87; 327/108, 109
See application file for complete search history.

(56) References Cited

U.S. PATENT DOCUMENTS

| | | | |
|---|---|---|---|
| 5,285,117 A | | 2/1994 | Furutani |
| 5,883,527 A | | 3/1999 | Saito |
| 5,973,534 A | * | 10/1999 | Singh ........................... 327/309 |
| 6,057,717 A | * | 5/2000 | Kawano et al. ............... 327/112 |
| 6,169,432 B1 | * | 1/2001 | Sharpe-Geisler ............. 327/112 |
| 6,246,262 B1 | * | 6/2001 | Morgan et al. .................. 326/81 |
| 6,288,582 B1 | * | 9/2001 | Shigehara ..................... 327/112 |
| 6,400,191 B2 | * | 6/2002 | Kawano et al. ............... 327/112 |
| 6,414,891 B2 | | 7/2002 | Kuge et al. |
| 7,626,440 B1 | * | 12/2009 | Atesoglu ....................... 327/333 |
| 2009/0140770 A1 | * | 6/2009 | Uno ............................... 326/81 |

FOREIGN PATENT DOCUMENTS

| | | |
|---|---|---|
| JP | 57-154942 A | 9/1982 |
| JP | 1-137807 A | 5/1989 |
| JP | 2-119427 | 5/1990 |
| JP | 3-283713 | 12/1991 |
| JP | 5-102831 A | 4/1993 |
| JP | 8-107345 | 4/1996 |
| JP | 9-205358 A | 8/1997 |

OTHER PUBLICATIONS

Hyunggon Kim, et al., "A 159mm² 32nm 32Gb MLC NAND-Flash Memory with 200MB/s Asynchronous DDR Interface", ISSCC 2010 / Session 24 / DRAM & Flash Memories / 24.6, 2010 IEEE International Solid-State Circuits Conference, pp. 442-443.
Dean Nobunaga, et al., "A 50nm 8Gb NAND Flash Memory with 100MB/s Program Throughput and 200MB/s DDR Interface", ISSCC 2008 / Session 23 / Non-Volatile Memory / 23.4, 2008 IEEE International Solid-State Circuits Conference, 3 pages.
Japanese Office Action issued Jun. 19, 2012 in Patent Application No. 2010-047858 with English Translation.

* cited by examiner

*Primary Examiner* — Thienvu Tran
(74) *Attorney, Agent, or Firm* — Oblon, Spivak, McClelland, Maier & Neustadt, L.L.P.

(57) ABSTRACT

According to one embodiment, a clamp transistor is inserted in series between a P-channel field effect transistor and an N-channel field effect transistor and an intermediate level between a high potential supplied to a source of the P-channel field effect transistor and a low potential supplied to a source of the N-channel field effect transistor is input into a gate of the clamp transistor to clamp a drain potential of the N-channel field effect transistor.

14 Claims, 17 Drawing Sheets

OUTPUT BUFFER

CROSS-REFERENCE TO RELATED APPLICATIONS

This application is based upon and claims the benefit of priority from the prior Japanese Patent Application No. 2010-047858, filed on Mar. 4, 2010; the entire contents of which are incorporated herein by reference.

FIELD

Embodiments described herein relate generally to an output buffer.

BACKGROUND

A CMOS buffer may be used as an output buffer for data communication among semiconductor chips in terms of power saving. An output from the CMOS buffer transits between a low power supply potential and a high power supply potential at a full amplitude.

Further, in order to achieve power saving of the CMOS buffer, there is a method that a source of an N-channel MOS transistor constituting a CMOS inverter circuit is connected to a low potential side power supply via a P-channel MOS transistor to supply an intermediate level between the high potential side power supply and the low potential side power supply to a gate of the P-channel MOS transistor.

However, with the method, an amplitude of an output signal of the output buffer is reduced, which causes a reduction in drive capability. Thus, there is a problem that when a load capacity imposed on the output buffer increases, a deterioration in signal waveform such as falling before sufficient rising occurs.

Further, with the method, there is a problem that since a pad electrode needs to be provided for each output buffer and the pad electrode cannot be shared between an output buffer and an input buffer, the number of pad electrodes increases.

DETAILED DESCRIPTION

In general, according to embodiments, a clamp output stage and a data input part are provided. A field effect transistor for potential clamp is inserted in series between a P-channel field effect transistor and an N-channel field effect transistor and an intermediate level between a high potential supplied to a source of the P-channel field effect transistor and a low potential supplied to a source of the N-channel field effect transistor is input into a gate of the field effect transistor for potential clamp so that the clamp output stage clamps a drain potential of the P-channel field effect transistor or a drain potential of the N-channel field effect transistor. The data input part is connected to the front of the clamp output stage and inputs a data signal into a gate of the P-channel field effect transistor and a gate of the N-channel field effect transistor based on an enable signal during data output.

The output buffer according to the embodiments of the present invention will be described below with reference to the drawings. The present invention is not limited to the embodiments.

First Embodiment

Figure 1A:
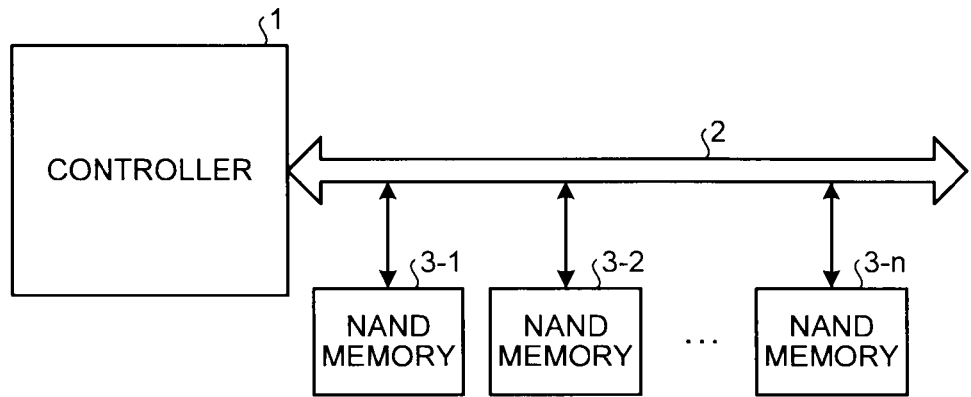
FIG. 1A is a block diagram showing a schematic structure of a semiconductor device to which an output buffer according to a first embodiment is applied.
Figure 1B:
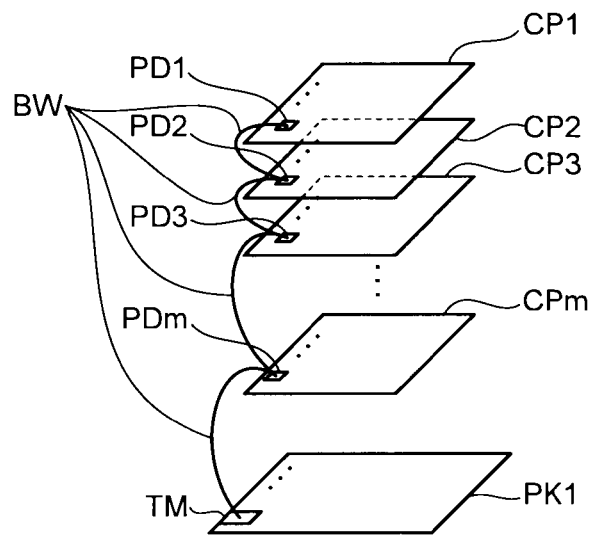
FIG. 1B is a perspective view showing a structure example of a NAND memory of FIG. 1A.
Figure 10:
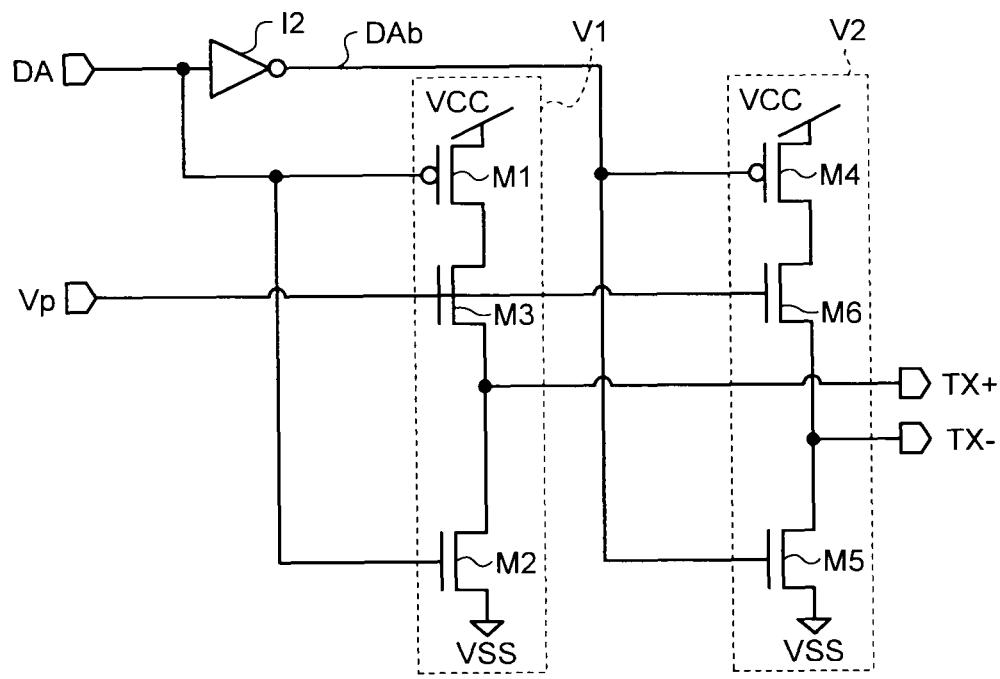
FIG. 10 is a circuit diagram showing an exemplary schematic structure of an output buffer according to a fourth embodiment.

FIG. 1A is a block diagram showing a schematic structure of a semiconductor device to which an output buffer according to a first embodiment of the present invention is applied, FIG. 1B is a perspective view showing a structure example of a NAND memory of FIG. 1A, and FIG. 10 is a perspective view showing a structure example of a semiconductor chip of FIG. 1B.

In FIG. 1A, the semiconductor device is provided with n (n is an integer of 2 or more) NAND memories 3-1 to 3-n, and a controller 1 configured to perform drive control on the NAND memories 3-1 to 3-n. The drive control for the NAND memories 3-1 to 3-n includes read/write control for the NAND memories 3-1 to 3-n, block selection, error correction and wear leveling, for example.

The NAND memories 3-1 to 3-n are connected to the controller 1 via a channel 2 in parallel to each other. For example, as shown in FIG. 1B, the NAND memory 3-1 is provided with m (m is an integer of 2 or more) semiconductor chips CP1 to CPm and pad electrodes PD1 to PDm are formed in the semiconductor chips CP1 to CPm, respectively.

Figure 1C:
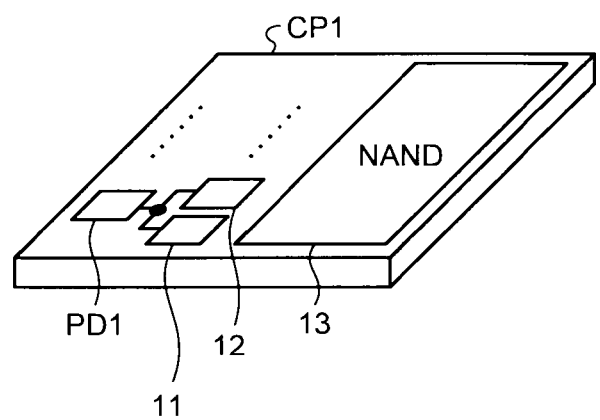
FIG. 1C is a perspective view showing a structure example of a semiconductor chip of FIG. 1B.

For example, as shown in FIG. 1C, the semiconductor chip CP1 mounts thereon an input buffer 11, an output buffer 12 and a NAND flash memory 13. An input terminal of the input buffer 11 and an output terminal of the output buffer 12 are connected to the pad electrodes PD1 to PDm. The NAND flash memory 13 may be provided with a unit cell array, a decoder, a sense amplifier, a charge pump circuit and a page buffer, for example.

The input buffer 11 can pass a control signal such as written data or address sent from the controller 1 to the NAND flash memory 13 or the like. The output buffer 12 can pass data read from the NAND flash memory 13 to the controller 1. The output buffer 12 can be employed as a single end type interface and can use a signal which transits between a power supply and a ground level at a full amplitude. Alternatively, a signal obtained by clamping the signal which transits between a power supply and a ground level at a full amplitude may be used. The above is applicable to the semiconductor chips CP2 to CPm other than the semiconductor chip CP1.

The m semiconductor chips CP1 to CPm are mounted on one semiconductor package PK1 and an external terminal TM of the semiconductor package PK1 is shared among the pad electrodes PD1 to PDm of the m semiconductor chips CP1 to CPm. The method for mounting the semiconductor chips CP1 to CPm on the semiconductor package PK1 may include a method for stacking the semiconductor chips CP1 to CPm or a method for arranging the semiconductor chips CP1 to CPm on the same plane. The semiconductor chips CP1 to CPm may be mounted in a face-down manner or face-up manner. For the method for sharing one external terminal TM among the m pad electrodes PD1 to PDm, the m pad electrodes PD1 to PDm and the external terminal TM can be connected via a bonding wire BW. Alternatively, the semiconductor chips CP1 to CPm may be flip-mounted to mutually connect the pad electrodes PD1 to PDm and the external terminal TM via bump electrodes formed on the pad electrodes PD1 to PDm. Alternatively, through electrodes may be formed on the semiconductor chips CP1 to CPm to mutually connect the pad electrodes PD1 to PDm and the external terminal TM via the through electrodes. The above is applicable to the NAND memories 3-2 to 3-n other than the NAND memory 3-1. The semiconductor device may be used as a storage device such as memory card or SSD.

Figure 2:
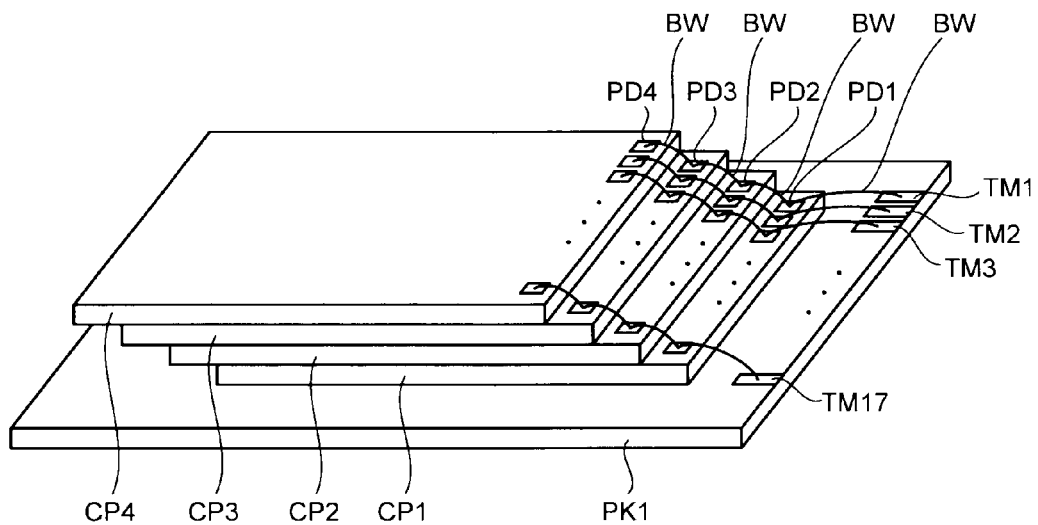
FIG. 2 is a perspective view showing one exemplary schematic structure of a NAND memory 3-1 of FIG. 1A.

FIG. 2 is a perspective view showing an exemplary schematic structure of the NAND memory 3-1 of FIG. 1A.

In FIG. 2, the pad electrodes PD1 to PD4 are formed on the semiconductor chips CP1 to CP4, respectively. The pad electrodes PD1 to PD4 may be used as an address terminal, a read/write terminal, a chip select terminal or a data terminal, for example. The external terminals TM1 to TM17 are formed on the semiconductor package PK. When the four semiconductor chips CP1 to CP4 are stacked to be mounted on the semiconductor package PK1, the semiconductor chips CP1 to CP4 may be stacked in an offset manner such that the pad electrodes PD1 to PD4 are exposed. The pad electrodes PD1 to PD4 are commonly connected to the external terminal TM1, for example, via the bonding wire BW so that the external terminal TM1 can be shared among the pad electrodes PD1 to PD4 of the four semiconductor chips CP1 to CP4.

Figure 3:
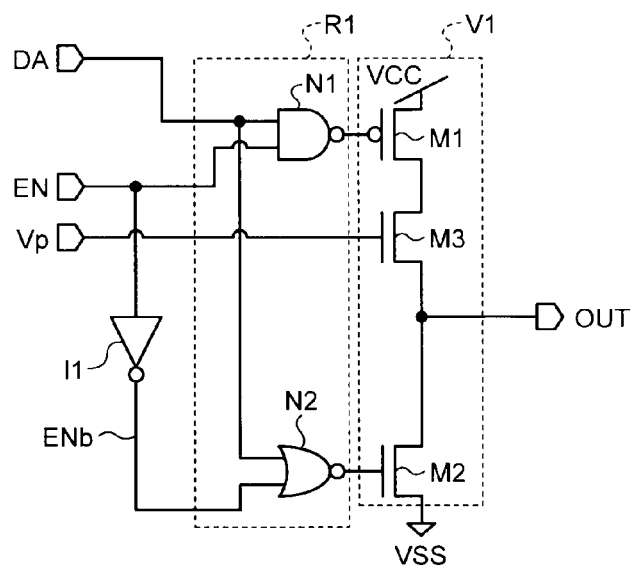
FIG. 3 is a circuit diagram showing an exemplary schematic structure of the output buffer of FIG. 1C.

FIG. 3 is a circuit diagram showing an exemplary schematic structure of the output buffer of FIG. 1C.

In FIG. 3, the output buffer is provided with a clamp output part V1, a data input part R1 and an inverter I1. The data input part R1 is connected to the front of the clamp output part V1.

The clamp output part V1 is provided with a P-channel field effect transistor M1, an N-channel field effect transistor M2 and a clamp transistor M3. An N-channel field effect transistor is used as the clamp transistor M3 herein. The clamp transistor M3 is inserted in series between the P-channel field effect transistor M1 and the N-channel field effect transistor M2. A high potential VCC is supplied to a source of the P-channel field effect transistor M1 and a low potential VSS is supplied to a source of the N-channel field effect transistor M2. The low potential VSS may be a ground potential. A clamp signal Vp is input into a gate of the clamp transistor M3 and a drain potential of the N-channel field effect transistor M2 can be extracted as an output signal OUT of the clamp output part V1. The clamp signal Vp can be set at an intermediate level between the high potential VCC and the low potential VSS. The intermediate level is not limited to a middle level between the high potential VCC and the low potential VSS and may be a level between the high potential VCC and the low potential VSS.

The data input part R1 is provided with a NAND circuit N1 and a NOR circuit N2. An output terminal of the NAND circuit N1 is connected to a gate of the P-channel field effect transistor M1 and an output terminal of the NOR circuit N2 is connected to a gate of the N-channel field effect transistor M2. A data signal DA is input into one input terminal of the NAND circuit N1 and an enable signal EN is input into the other input terminal of the NAND circuit N1. The data signal DA is input into one input terminal of the NOR circuit N2 and an enable inversion signal ENb which is inverted from the enable signal EN is input into the other input terminal of the NOR circuit N2. The enable inversion signal ENb is generated by inverting the enable signal EN in the inverter I1.

Then, NAND by the data signal DA and the enable signal EN is operated in the NAND circuit N1 and the operation result is input into the gate of the P-channel field effect transistor M1. NOR by the data signal DA and the enable inversion signal ENb is operated in the NOR circuit N2 and the operation result is input into the gate of the N-channel field effect transistor M2.

Thus, when the enable signal EN enters high level, either one of the P-channel field effect transistor M1 and the N-channel field effect transistor M2 can be powered on depending on the data signal DA, and when the enable signal EN enters low level, both the P-channel field effect transistor M1 and the N-channel field effect transistor M2 can be powered off irrespective of the data signal DA.

Thereby, the output signal OUT of the clamp output part V1 may be in a floating state or fixed at a predetermined potential depending on the enable signal EN, and also when the pad electrode PD1 is shared between the input buffer 11 and the output buffer 12 as shown in FIGS. 1A, 1B and 10, the input signal of the input buffer 11 and the output signal of the output buffer 12 can be prevented from interfering with each other, thereby reducing the number of pad electrodes PD1 in the semiconductor chip CP1.

When the P-channel field effect transistor M1 is powered on while the clamp signal Vp is being input into the gate of the clamp transistor M3, the output signal OUT of the clamp output part V1 is clamped at a value (an intermediate level VM between the high potential VCC and the low potential VSS) obtained by subtracting a threshold voltage of the clamp transistor M3 from the potential of the clamp signal Vp. Therefore, also when the high potential VCC and the low potential VSS are supplied as the power supply voltages of the clamp output part V1, the output signal OUT can transit between the intermediate level VM and the low potential VSS and the amplitude of the output signal OUT can be reduced, thereby achieving power saving of the output buffer.

In other words, a consumption power P of the output buffer can be given in the following formula (1).

$$P = f \times c \times V^2 \qquad (1)$$

where f is an operation frequency, c is a parasitic capacity of the output buffer, and v is an amplitude of the output signal OUT. Thus, since the consumption power P of the output buffer is proportional to the square of the amplitude V of the output signal OUT, the amplitude V of the output signal OUT is reduced, thereby reducing the consumption power P of the output buffer.

Second Embodiment

Figure 4:
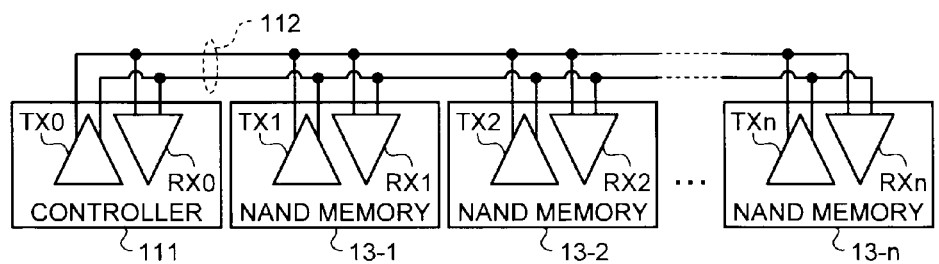
FIG. 4 is a block diagram showing a schematic structure of a semiconductor device to which an output buffer according to a second embodiment is applied.

FIG. 4 is a block diagram showing a schematic structure of a semiconductor device to which an output buffer according to a second embodiment of the present invention is applied.

In FIG. 4, the semiconductor device is provided with n NAND memories 13-1 to 13-n, and a controller 111 configured to conduct drive control on the NAND memories 13-1 to 13-n. The NAND memories 13-1 to 13-n are connected to the controller 111 via a differential transmission path 112 in parallel to each other.

The controller 111 is provided with an output buffer TX0 and an input buffer RX0. The NAND memories 13-1 to 13-n are provided with the output buffers TX1 to TXn and the input buffers RX1 to RXn, respectively. The output buffers TX0 to TXn can employ a differential signal as output signal and the input buffers RX1 to RXn can employ a differential signal as input signal.

A data signal from the controller 111 is differentiated in the output buffer TX0 and is input into the input buffers RX1 to RXn via the differential transmission path 112 thereby to be sent to the NAND memories 13-1 to 13-n. The data signals from the NAND memories 13-1 to 13-n are differentiated in the output buffers TX1 to TXn, respectively, and are input into the input buffer RX0 via the differential transmission path 112 thereby to be sent to the controller 111.

The data signals exchanged between the controller 111 and the NAND memories 13-1 to 13-n are differentiated, thereby obtaining noise resistance, reducing the amplitude of the output signals of the output buffers TX0 to TXn, and achieving power saving of the output buffer.

Figure 5:
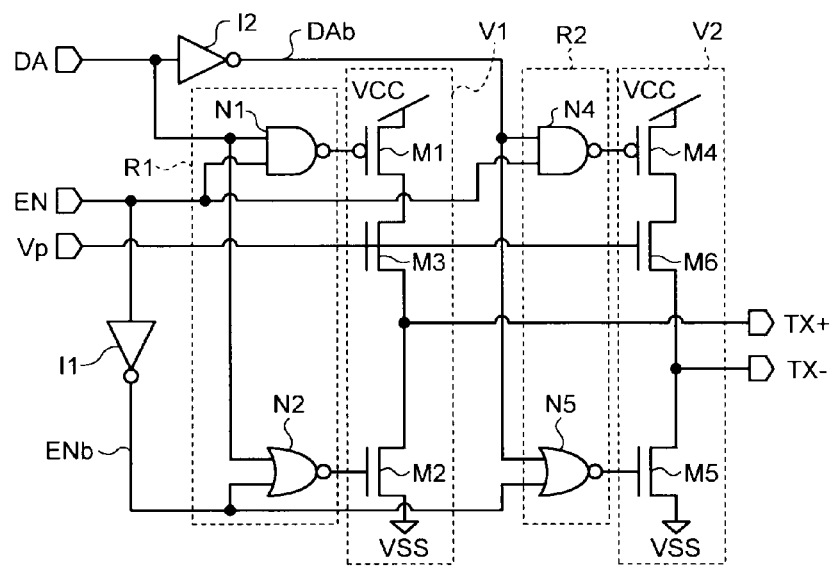
FIG. 5 is a circuit diagram showing an exemplary schematic structure of the output buffer of FIG. 4.
Figure 6:
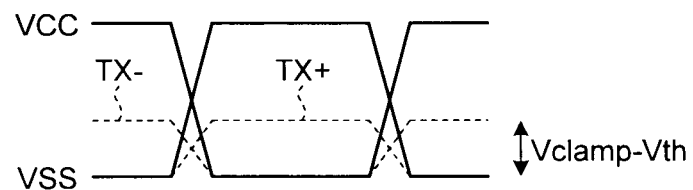
FIG. 6 is a diagram showing a waveform of a differential output signal of the output buffer of FIG. 5.

FIG. 5 is a circuit diagram showing an exemplary schematic structure of the output buffer of FIG. 4 and FIG. 6 is a diagram showing a waveform of the differential output signal of the output buffer of FIG. 5.

In FIG. 5, the output buffer is provided with a clamp output part V2, a data input part R2 and an inverter I2 in addition to the constituents of the output buffer of FIG. 3. The data input part R2 is connected to the front of the clamp output part V2.

The clamp output part V2 is provided with a P-channel field effect transistor M4, an N-channel field effect transistor M5 and a clamp transistor M6. An N-channel field effect transistor is employed as the clamp transistor M6 herein. The clamp transistor M6 is inserted in series between the P-channel field effect transistor M4 and the N-channel field effect transistor M5. The high potential VCC is supplied to a source of the P-channel field effect transistor M4 and the low potential VSS is supplied to a source of the N-channel field effect transistor M5. The clamp signal Vp is input into a gate of the clamp transistor M6. The drain potential of the N-channel field effect transistor M2 can be extracted as an output signal TX+ of the clamp output part V1 and a drain potential of the N-channel field effect transistor M5 can be extracted as an output signal TX− of the clamp output part V2. The output signals TX+ and TX− are in a complementary relation and can constitute a differential output signal.

The data input part R2 is provided with a NAND circuit N4 and a NOR circuit N5. An output terminal of the NAND circuit N4 is connected to a gate of the P-channel field effect transistor M4 and an output terminal of the NOR circuit N5 is connected to a gate of the N-channel field effect transistor M5. A data inversion signal DAb which is inverted from the data signal DA is input into one input terminal of the NAND circuit N4 and the enable signal EN is input into the other input terminal of the NAND circuit N4. The data inversion signal DAb is input into one input terminal of the NOR circuit N5 and the enable inversion signal ENb which is inverted from the enable EN is input into the other input terminal of the NOR circuit N5. The data inversion signal DAb is generated by inverting the data signal DA in the inverter I2.

Then, NAND by the data signal DA and the enable signal EN is operated in the NAND circuit N1 and the operation result is input into the gate of the P-channel field effect transistor M1. NOR by the data signal DA and the enable inversion signal ENb is operated in the NOR circuit N2 and the operation result is input into the gate of the N-channel field effect transistor M2.

NAND by the data inversion signal DAb and the enable signal EN is operated in the NAND circuit N4 and the operation result is input into the gate of the P-channel field effect transistor M4. NOR by the data inversion signal DAb and the enable inversion signal ENb is operated in the NOR circuit N5 and the operation result is input into the gate of the N-channel field effect transistor M5.

Since there is configured such that the data signal DA is input into the data input part R1 and the data inversion signal DAb is input into the data input part R2, when the P-channel field effect transistor M1 is powered on, the N-channel field effect transistor M5 is powered on, and when the N-channel field effect transistor M2 is powered on, the P-channel field effect transistor M4 is powered on. Therefore, the clamp output parts V1 and V2 operate in a complementary manner so that the output signals TX+ and TX− are differentiated.

When the P-channel field effect transistor M1 is powered on while the clamp signal Vp is being input into the gate of the clamp transistor M3, the output signal TX+ of the clamp output part V1 is clamped at a value (an intermediate level VM between the high potential VCC and the low potential VSS) obtained by subtracting a threshold voltage Vth of the clamp transistor M3 from the potential Vclamp of the clamp signal Vp as shown in FIG. 6. When the P-channel field effect transistor M4 is powered on while the clamp signal Vp is being input into the gate of the clamp transistor M6, the output signal TX− of the clamp output part V2 is clamped at a value (an intermediate level VM between the high potential VCC and the low potential VSS) obtained by subtracting a threshold voltage Vth of the clamp transistor M6 from the potential Vclamp of the clamp signal Vp.

Therefore, also when the high potential VCC and the low potential VSS are supplied as the power supply voltages of the clamp output parts V1 and V2, the output signals TX+ and TX− are differentiated while the output signals TX+ and TX− can transit between the intermediate level VM and the low potential VSS, thereby obtaining noise resistance and achieving power saving of the output buffer.

Since when the differentiated output signals TX+ and TX− are generated, the circuit size is twice the structure of FIG. 3, the consumption power increases accordingly but the amplitudes of the output signals TX+ and TX− can be reduced by the amount of differentiation of the output signals TX+ and TX−. Since the parasitic capacity is proportional to the circuit size and the consumption power is proportional to the square of the amplitude and the parasitic capacity as indicated in the formula (1), the consumption power can be reduced due to a decrease in amplitude rather than an increase in consumption power due to the increase in circuit size, thereby entirely reducing the consumption power.

Figure 7:
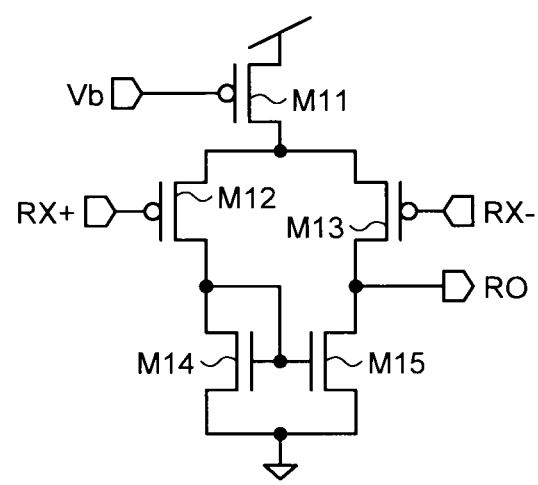
FIG. 7 is a circuit diagram showing an exemplary schematic structure of an input buffer of FIG. 4.

FIG. 7 is a circuit diagram showing an exemplary schematic structure of the input buffer of FIG. 4.

In FIG. 7, the input buffer is provided with P-channel field effect transistors M11 to M13 and N-channel field effect transistors M14, M15. The P-channel field effect transistor M12 and the N-channel field effect transistor M14 are connected to each other in series and the P-channel field effect transistor M13 and the N-channel field effect transistor M15 are connected to each other in series. A source of the P-channel field effect transistor M12 and a source of the P-channel field effect transistor M13 are connected to a drain of the P-channel field effect transistor M11, and a gate of the N-channel field effect transistor M14 and a gate of the N-channel field effect transistor M15 are connected to a drain of the P-channel field effect transistor M12.

A bias voltage Vb is input into a gate of the P-channel field effect transistor M11. An input signal RX+ is input into a gate of the P-channel field effect transistor M12 and an input signal RX− is input into a gate of the P-channel field effect transistor M13 so that an output signal RO is output from a drain of the P-channel field effect transistor M13. The output signals TX+ and TX− of FIG. 5 may be employed as the input signals RX+ and RX−, respectively.

Third Embodiment

Figure 8:
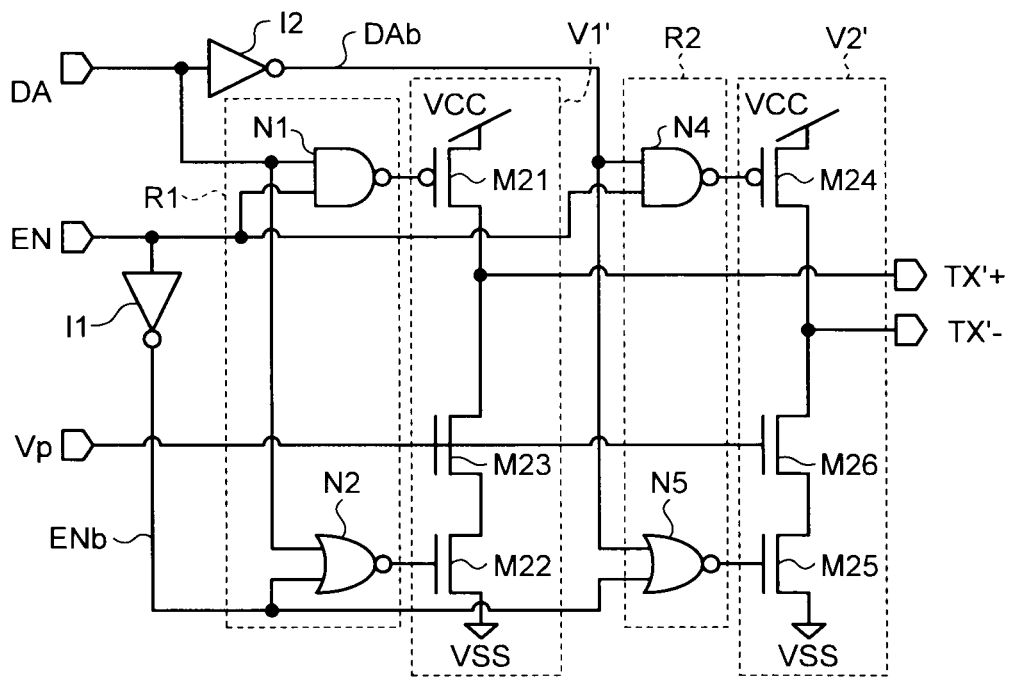
FIG. 8 is a circuit diagram showing an exemplary schematic structure of an output buffer according to a third embodiment.
Figure 9:
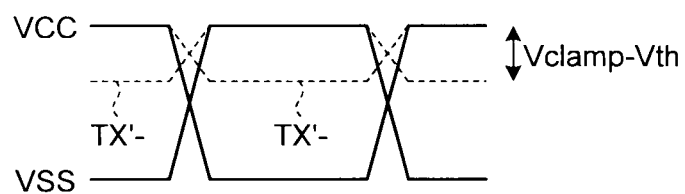
FIG. 9 is a diagram showing a waveform of a differential output signal of the output buffer of FIG. 8.

FIG. 8 is a circuit diagram showing an exemplary schematic structure of an output buffer according to a third embodiment of the present invention and FIG. 9 is a diagram showing a waveform of a differential output signal of the output buffer of FIG. 8.

In FIG. 8, the output buffer is provided with clamp output parts V1' and V2' instead of the clamp output parts V1 and V2 of FIG. 5.

The clamp output part V1' is provided with a P-channel field effect transistor M21, an N-channel field effect transistor M22 and a clamp transistor M23. The clamp transistor M23 is inserted in series between the P-channel field effect transistor M21 and the N-channel field effect transistor M22. The high voltage VCC is supplied to a source of the P-channel field effect transistor M21 and the low potential VSS is supplied to a source of the N-channel field effect transistor M22. The clamp signal Vp is input into a gate of the clamp transistor M23.

The clamp output part V2' is provided with a P-channel field effect transistor M24, an N-channel field effect transistor M25 and a clamp transistor M26. The clamp transistor M26 is inserted in series between the P-channel field effect transistor M24 and the N-channel field effect transistor M25. The high potential VCC is supplied to a source of the P-channel field effect transistor M24 and the low potential VSS is supplied to a source of the N-channel field effect transistor M25. The clamp signal Vp is input into a gate of the clamp transistor M26.

In the third embodiment, P-channel field effect transistors are employed as the clamp transistors M23 and M26.

A drain potential of the P-channel field effect transistor M21 can be extracted as an output signal TX'+ of the clamp output part V1' and a drain potential of the P-channel field effect transistor M24 can be extracted as an output signal TX'− of the clamp output part V2'.

Then, NAND by the data signal DA and the enable signal EN is operated in the NAND circuit N1 and the operation result is input into a gate of the P-channel field effect transistor M21. NOR by the data signal DA and the enable inversion signal ENb is operated in the NOR circuit N2 and the operation result is input into a gate of the N-channel field effect transistor M22.

NAND by the data inversion signal DAb and the enable signal EN is operated in the NAND circuit N4 and the operation result is input into a gate of the P-channel field effect transistor M24. NOR by the data inversion signal DAb and the enable inversion signal ENb is operated in the NOR circuit N5 and the operation result is input into a gate of the N-channel field effect transistor M25.

Since there is configured such that the data signal DA is input into the data input part R1 and the data inversion signal DAb is input into the data input part R2, when the P-channel field effect transistor M21 is powered on, the N-channel field effect transistor M25 is powered on, and when the N-channel field effect transistor M22 is powered on, the P-channel field effect transistor M24 is powered on. Therefore, the clamp output parts V1' and V2' operate in a complementary manner so that the output signals TX'+ and TX'− are differentiated.

When the N-channel field effect transistor M22 is powered on while the clamp signal Vp is being input into the gate of the clamp transistor M23, the output signal TX'+ of the clamp output part V1' is clamped at a value (an intermediate level VM between the high potential VCC and the low potential VSS) obtained by subtracting a threshold voltage Vth of the clamp transistor M23 from the potential Vclamp of the clamp signal Vp as shown in FIG. 9. When the N-channel field effect transistor M25 is powered on while the clamp signal Vp is being input into a gate of the clamp transistor M26, the output signal TX'− of the clamp output part V2' is clamped at a value (an intermediate level VM between the high potential VCC and the low potential VSS) obtained by subtracting a threshold voltage Vth of the clamp transistor M26 from the potential Vclamp of the clamp signal Vp.

Therefore, also when the high potential VCC and the low potential VSS are supplied as the power supply voltages of the clamp output parts V1' and V2', the output signals TX'+ and TX'− are differentiated while the output signals TX'+ and TX'− can transit between the high potential VCC and the intermediate level VM, thereby obtaining noise resistance and achieving power saving of the output buffer.

Fourth Embodiment

FIG. 10 is a circuit diagram showing an exemplary schematic structure of an output buffer according to a fourth embodiment of the present invention.

In FIG. 10, the output buffer is provided with the clamp output parts V1, V2 and the inverter I2. The data signal DA is input into the gate of the P-channel field effect transistor M1 and the gate of the N-channel field effect transistor M2 and the data inversion signal DAb is input into the gate of the P-channel field effect transistor M4 and the gate of the N-channel field effect transistor M5.

Since there is configured such that the data signal DA is input into the gate of the P-channel field effect transistor M1 and the gate of the N-channel field effect transistor M2 and the data inversion signal DAb is input into the gate of the P-channel field effect transistor M4 and the gate of the N-channel field effect transistor M5, when the P-channel field effect transistor M1 is powered on, the N-channel field effect transistor M5 is powered on, and when the N-channel field effect transistor M2 is powered on, the P-channel field effect transistor M4 is powered on. Therefore, the clamp output parts V1 and V2 operate in a complementary manner so that the output signals TX+ and TX− are differentiated.

When the P-channel field effect transistor M1 is powered on while the clamp signal Vp is being input into the gate of the clamp transistor M3, the output signal TX+ of the clamp output part V1 is clamped at a value (an intermediate level VM between the high potential VCC and the low potential VSS) obtained by subtracting a threshold voltage Vth of the clamp transistor M3 from the potential Vclamp of the clamp signal Vp as shown in FIG. 6. When the P-channel field effect transistor M4 is powered on while the clamp signal Vp is being input into the gate of the clamp transistor M6, the output signal TX− of the clamp output part V2 is clamped at a value (an intermediate level VM between the high potential VCC and the low potential VSS) obtained by subtracting a threshold voltage Vth of the clamp transistor M6 from the potential Vclamp of the clamp signal Vp.

Therefore, also when the high potential VCC and the low potential VSS are supplied as the power supply voltages of the clamp output parts V1 and V2, the output signals TX+ and TX− are differentiated while the output signals TX+ and TX− can transit between the intermediate level VM and the low potential VSS, thereby obtaining noise resistance and achieving power saving of the output buffer.

In the structure of FIG. 10, the data input parts R1 and R2 can be omitted from the structure of FIG. 5 and the circuit size can be reduced, thereby reducing the area of the output buffer.

The way the data input parts R1 and R2 are omitted from the structure of FIG. 5 is described in the embodiment of FIG. 10 but the data input parts R1 and R2 may be omitted from the structure of FIG. 8.

Fifth Embodiment

Figure 11:
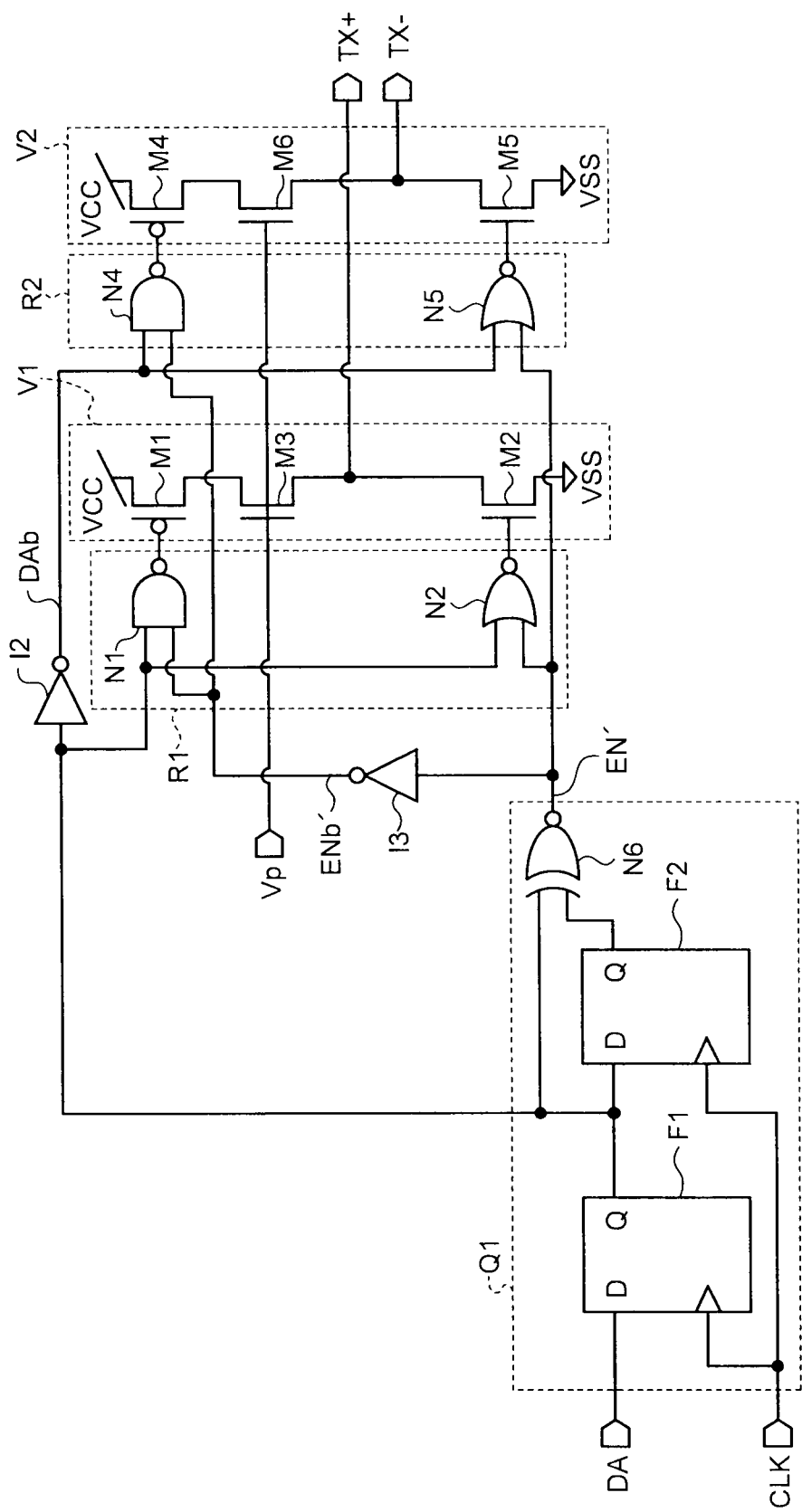
FIG. 11 is a circuit diagram showing an exemplary schematic structure of an output buffer according to a fifth embodiment.

FIG. 11 is a circuit diagram showing an exemplary schematic structure of an output buffer according to a fifth embodiment of the present invention.

In FIG. 11, the output buffer is provided with an input data deciding part Q1 in addition to the constituents of the output buffer of FIG. 5, and an inverter I3 instead of the inverter I1 of FIG. 5. The input data deciding part Q1 permits the data signal DA to be input into the clamp output part V1 and permits the data inversion signal DAb to be input into the clamp output part V2 only when the data signal DA changes, thereby generating an enable signal EN'.

The input data deciding part Q1 is provided with flip-flops F1, F2 and an XOR circuit N6. The flip-flop F2 is connected to the rear of the flip-flop F1, an output terminal of the flip-flop F1 is connected to one input terminal of the XOR circuit N6, and an output terminal of the flip-flop F2 is connected to the other input terminal of the XOR circuit N6.

The data signal DA one clock before is input into one input terminal of the NAND circuit N1 and an enable inversion signal ENb' which is inverted from the enable signal EN' is input into the other input terminal of the NAND circuit N1. The data signal DA one clock before is input into one input terminal of the NOR circuit N2 and the enable signal EN' is input into the other input terminal of the NOR circuit N2. The data inversion signal DAb which is inverted from the data signal DA one clock before is input into one input terminal of the NAND circuit N4 and the enable inversion signal ENb' is input into the other input terminal of the NAND circuit N4. The data inversion signal DAb is input into one input terminal of the NOR circuit N5 and the enable signal EN is input into the other input terminal of the NOR circuit N5. The enable inversion signal ENb' is generated by inverting the enable signal EN' in the inverter I3.

The data signal DA is sequentially held in the flip-flops F1 and F2 according to a clock signal CLK so that the data signal DA one clock before is output from the flip-flop F1 and the data signal DA two clocks before is output from the flip-flop F2. The data signal DA one clock before is compared with the data signal DA two clocks before in the XOR circuit N6 so that a decision is made as to whether the data signal DA has changed, and the decision result is output as the enable signal EN'.

Then, NAND by the data signal DA and the enable inversion signal ENb' is operated in the NAND circuit N1 and the operation result is input into the gate of the P-channel field effect transistor M1. NOR by the data signal DA and the enable signal EN' is operated in the NOR circuit N2 and the operation result is input into the gate of the N-channel field effect transistor M2.

NAND by the data inversion signal DAb and the enable inversion signal ENb' is operated in the NAND circuit N4 and the operation result is input into the gate of the P-channel field effect transistor M4. NOR by the data inversion signal DAb and the enable signal EN' is operated in the NOR circuit N5 and the operation result is input into the gate of the N-channel field effect transistor M5.

Since there is configured such that the data signal DA is input into the data input part R1 and the data inversion signal DAb is input into the data input part R2, when the P-channel field effect transistor M1 is powered on, the N-channel field effect transistor M5 is powered on, and when the N-channel field effect transistor M2 is powered on, the P-channel field effect transistor M4 is powered on. Therefore, the clamp output parts V1 and V2 operate in a complementary manner so that the output signals TX+ and TX− are differentiated.

Further, since there is configured such that the enable signal EN' and the enable inversion signal ENb' are used to operate the data input parts R1 and R2, the P-channel field effect transistors M1, M4 and the N-channel field effect transistors M2, M5 can be powered on/off according to the data signal DA and the data inversion signal DAb only when the data signal DA changes.

When the P-channel field effect transistor M1 is powered on while the clamp signal Vp is being input into the gate of the clamp transistor M3, the output signal TX+ of the clamp output part V1 is clamped at a value (an intermediate level VM between the high potential VCC and the low potential VSS) obtained by subtracting a threshold voltage Vth of the clamp transistor M3 from the potential Vclamp of the clamp signal Vp as shown in FIG. 6. When the P-channel field effect transistor M4 is powered on while the clamp signal Vp is being input into the gate of the clamp transistor M6, the output signal TX− of the clamp output part V2 is clamped at a value (an intermediate level VM between the high potential VCC and the low potential VSS) obtained by subtracting a threshold value Vth of the clamp transistor M6 from the potential Vclamp of the clamp signal Vp.

Therefore, also when the high potential VCC and the low potential VSS are supplied as the power supply voltages of the clamp output parts V1 and V2, the output signals TX+ and TX− are differentiated while the output signals TX+ and TX− can transit between the intermediate level VM and the low potential VSS, and the output signals TX+ and TX− cannot transit when the data signal DA does not change, thereby obtaining noise resistance and achieving power saving of the output buffer.

The way the input data deciding part Q1 is added to the constituents of the output buffer of FIG. 5 is described in the embodiment of FIG. 11 but the input data deciding part Q1 may be added to the constituents of the output buffer of FIG. 8.

Sixth Embodiment

Figure 12:
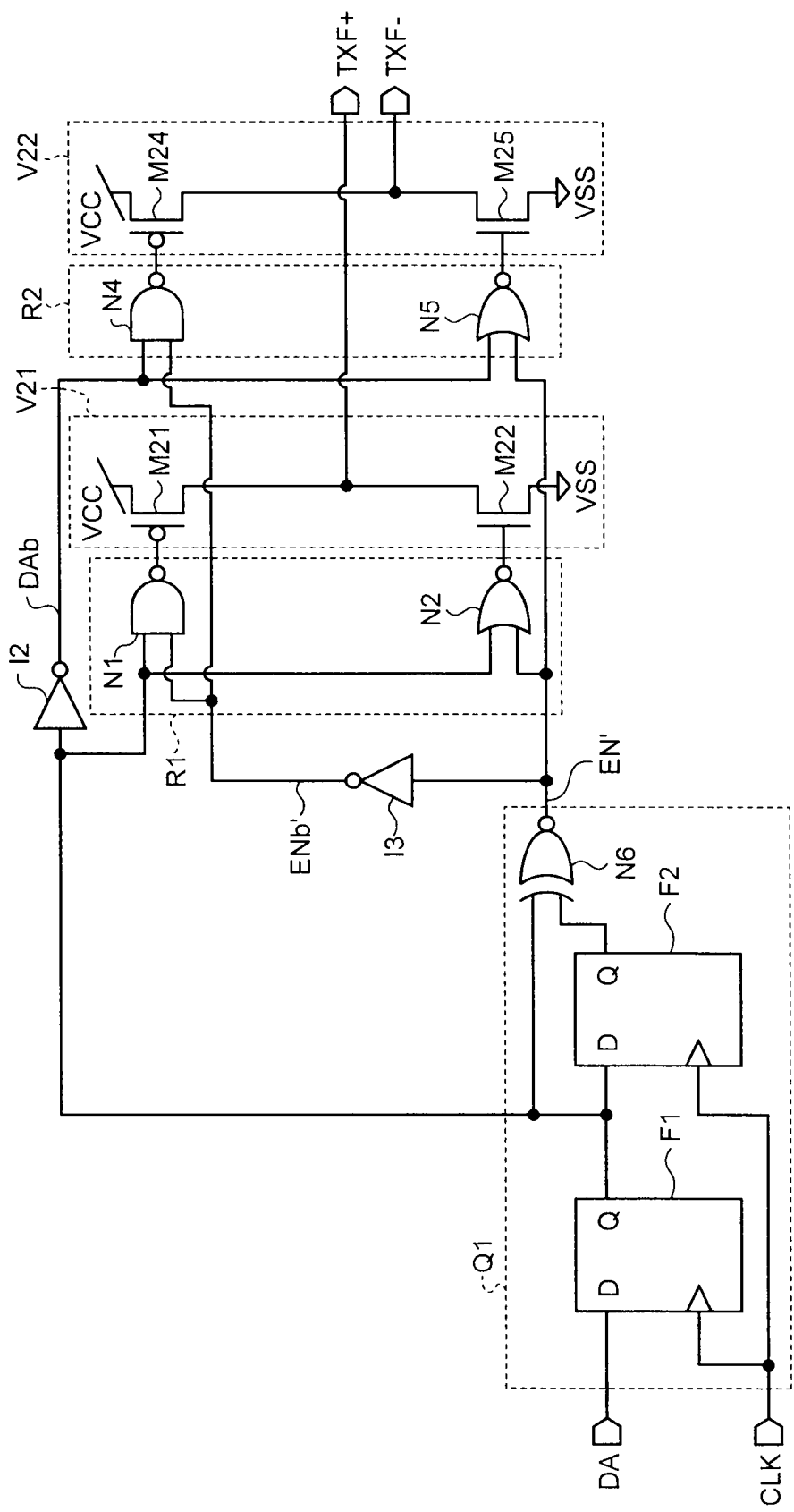
FIG. 12 is a circuit diagram showing an exemplary schematic structure of an output buffer according to a sixth embodiment.

FIG. 12 is a circuit diagram showing one exemplary schematic structure of an output buffer according to a sixth embodiment of the present invention.

In FIG. 12, the output buffer is provided with CMOS inverters V21 and V22 instead of the clamp output parts V1 and V2 of the output buffer of FIG. 11.

The CMOS inverter V21 is provided with the P-channel field effect transistor M21 and the N-channel field effect transistor M22. The high potential VCC is supplied to the source of the P-channel field effect transistor M21 and the low potential VSS is supplied to the source of the N-channel field effect transistor M22.

The CMOS inverter V22 is provided with the P-channel field effect transistor M24 and the N-channel field effect transistor M25. The high potential VCC is supplied to the source of the P-channel field effect transistor M24 and the low potential VSS is supplied to the source of the N-channel field effect transistor M25.

A drain potential of the N-channel field effect transistor M22 can be extracted as an output signal TXF+ of the CMOS inverter V21 and a drain potential of the N-channel field effect transistor M25 can be extracted as an output signal TXF− of the CMOS inverter V22.

The output terminal of the NAND circuit N1 is connected to the gate of the P-channel field effect transistor M21 and the output terminal of the NOR circuit N2 is connected to the gate of the N-channel field effect transistor M22. The output terminal of the NAND circuit N4 is connected to the gate of the P-channel field effect transistor M24 and the output terminal of the NOR circuit N5 is connected to the gate of the N-channel field effect transistor M25.

Then, NAND by the data signal DA and the enable inversion signal ENb' is operated in the NAND circuit N1 and the operation result is input into the gate of the P-channel field effect transistor M21. NOR by the data signal DA and the enable signal EN' is operated in the NOR circuit N2 and the operation result is input into the gate of the N-channel field effect transistor M22.

NAND by the data inversion signal DAb and the enable inversion signal ENb' is operated in the NAND circuit N4 and the operation result is input into the gate of the P-channel field effect transistor M24. NOR by the data inversion signal DAb and the enable signal EN' is operated in the NOR circuit N5 and the operation result is input into the gate of the N-channel field effect transistor M25.

Since there is configured such that the data signal DA is input into the data input part R1 and the data inversion signal DAb is input into the data input part R2, the CMOS inverters V21 and V22 operate in a complementary manner, the output signals TXF+ and TXF− transit between the high potential VCC and the low potential VSS at a full amplitude and the output signals TXF+ and the TXF− are differentiated.

Further, since there is configured such that the enable signal EN' and the enable inversion signal ENb' are used to operate the data input parts R1 and R2, the CMOS inverters V21 and V22 can be operated according to the data signal DA and the data inversion signal DAb only when the data signal DA changes.

Therefore, also when the output signals TXF+ and TXF− transit between the high potential VCC and the low potential VSS at a full amplitude, the output signals TX+ and TX− are differentiated, and the output signals TX+ and TX− cannot transit when the data signal DA does not change, thereby obtaining noise resistance and achieving power saving of the output buffer.

Seventh Embodiment

Figure 13:
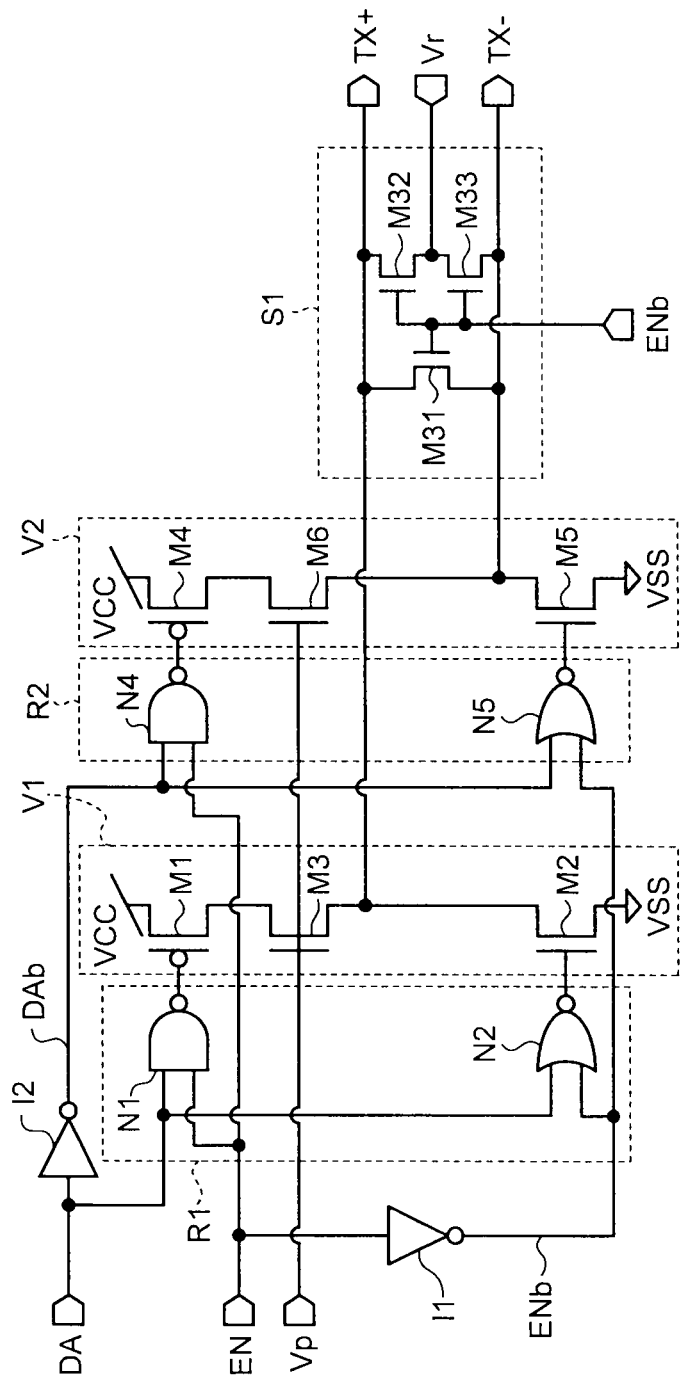
FIG. 13 is a circuit diagram showing an exemplary schematic structure of an output buffer according to a seventh embodiment.
Figure 14:
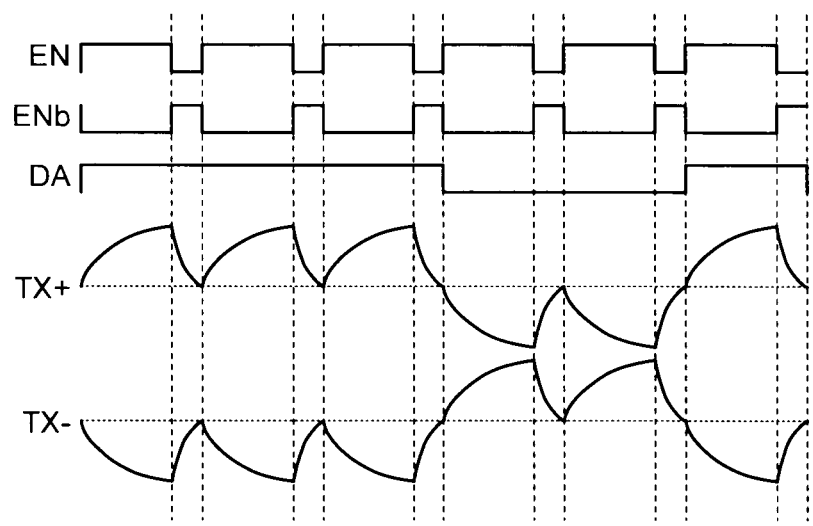
FIG. 14 is a diagram showing signal waveforms of the respective parts of the output buffer of FIG. 13.

FIG. 13 is a circuit diagram showing an exemplary schematic structure of an output buffer according to a seventh embodiment of the present invention and FIG. 14 is a diagram showing signal waveforms of the respective parts of the output buffer of FIG. 13.

In FIG. 13, the output buffer is provided with an output equalizing circuit S1 in addition to the constituents of the output buffer of FIG. 5. The output equalizing circuit S1 can average the output levels of the clamp output parts V1 and V2 per cycle.

The output equalizing circuit S1 is provided with N-channel field effect transistors M31 to M33. The N-channel field effect transistor M31 is connected between the drains of the N-channel field effect transistors M2 and M5. The N-channel field effect transistors M32 and M33 are connected to each other in series and the series circuit of the N-channels field effect transistors M32 and M33 is connected between the drains of the N-channel field effect transistors M2 and M5.

The enable inversion signal ENb is input into gates of the N-channel field effect transistors M31 to M33 and a precharge signal Vr is input into a source of the N-channel field effect transistor M32 and a drain of the N-channel field effect transistor M32. The precharge signal Vr can be set at a middle value between the output levels of the clamp output parts V1 and V2.

When the enable signal EN is at a low level, the data signal DA and the data inversion signal DAb are prohibited from being input into the clamp output parts V1 and V2 and the operations of the clamp output parts V1 and V2 are stopped. The N-channel field effect transistors M31 to M33 are powered on, and the precharge signal Vr is supplied while the drains of the N-channel field effect transistors M2 and M5 are short-circuited, so that the output levels of the clamp output parts V1 and V2 are averaged.

When the enable signal EN enters high level, the N-channel field effect transistors M31 to M33 are powered off and the clamp output parts V1 and V2 operate in a complementary manner so that the output signals TX+ and TX− differentiated according to the data signal DA are output.

The output levels of the clamp output parts V1 and V2 are averaged before the enable signal EN enters high level, so that the output signals TX+ and TX− can start transiting from a middle value between the output levels of the clamp output parts V1 and V2. Thus, the amplitudes of the output signals TX+ and TX− can be reduced and power saving of the output buffer can be achieved.

The way the output equalizing circuit S1 is added to the constituents of the output buffer of FIG. 5 is described in the embodiment of FIG. 13 but the output equalizing circuit S1 may be added to the constituents of the output buffer of FIG. 8. The way the data input parts R1 and R2 are provided in the output buffer is described in the embodiment of FIG. 13 but the data input parts R1 and R2 may be omitted similar to the structure of FIG. 10.

Eighth Embodiment

Figure 15:
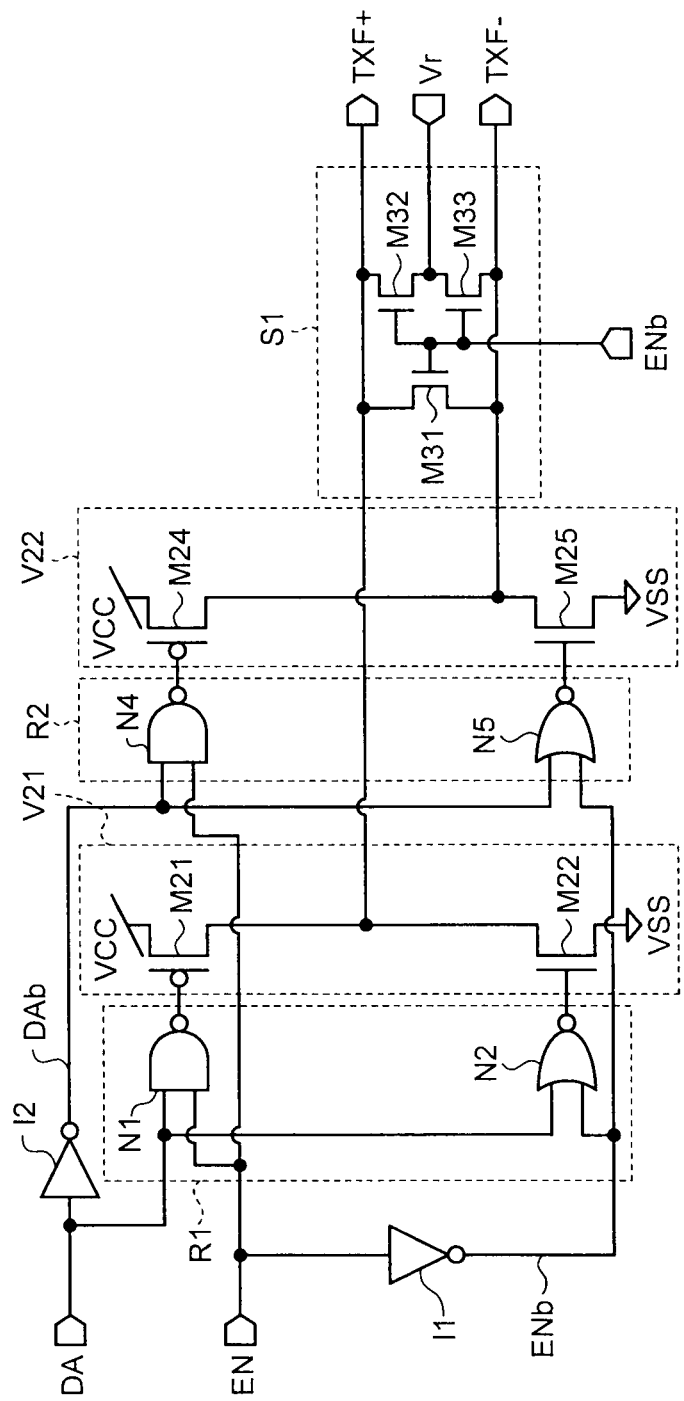
FIG. 15 is a circuit diagram showing an exemplary schematic structure of an output buffer according to an eighth embodiment.

FIG. 15 is a circuit diagram showing an exemplary schematic structure of an output buffer according to an eighth embodiment of the present invention.

In FIG. 15, the output buffer is provided with the CMOS inverters V21 and V22 instead of the clamp output parts V1 and V2 of the output buffer of FIG. 13.

When the enable signal EN is at a low level, the data signal DA and the data inversion signal DAb are prohibited from being input into the CMOS inverters V21 and V22 and the operations of the CMOS inverters V21 and V22 are stopped. The N-channel field effect transistors M31 to M33 are powered on and the precharge signal Vr is supplied while the outputs of the CMOS inverters V21 and V22 are short-circuited, so that the output levels of the CMOS inverters V21 and V22 are averaged.

When the enable signal EN enters high level, the N-channel field effect transistors M31 to M33 are powered off and the CMOS inverters V21 and V22 operate in a complementary manner so that the output signals TXF+ and TXF− differentiated according to the data signal DA are output.

The output levels of the CMOS inverters V21 and V22 are averaged before the enable signal EN enters high level, so that the output signals TXF+ and TXF− can start transiting from a middle value between the output levels of the CMOS inverters V21 and V22. Thus, the amplitudes of the output signals TXF+ and TXF− can be reduced and power saving of the output buffer can be achieved.

The way the data input parts R1 and R2 are provided in the output buffer is described in the embodiment of FIG. 15 but the data input parts R1 and R2 may be omitted.

Ninth Embodiment

Figure 16:
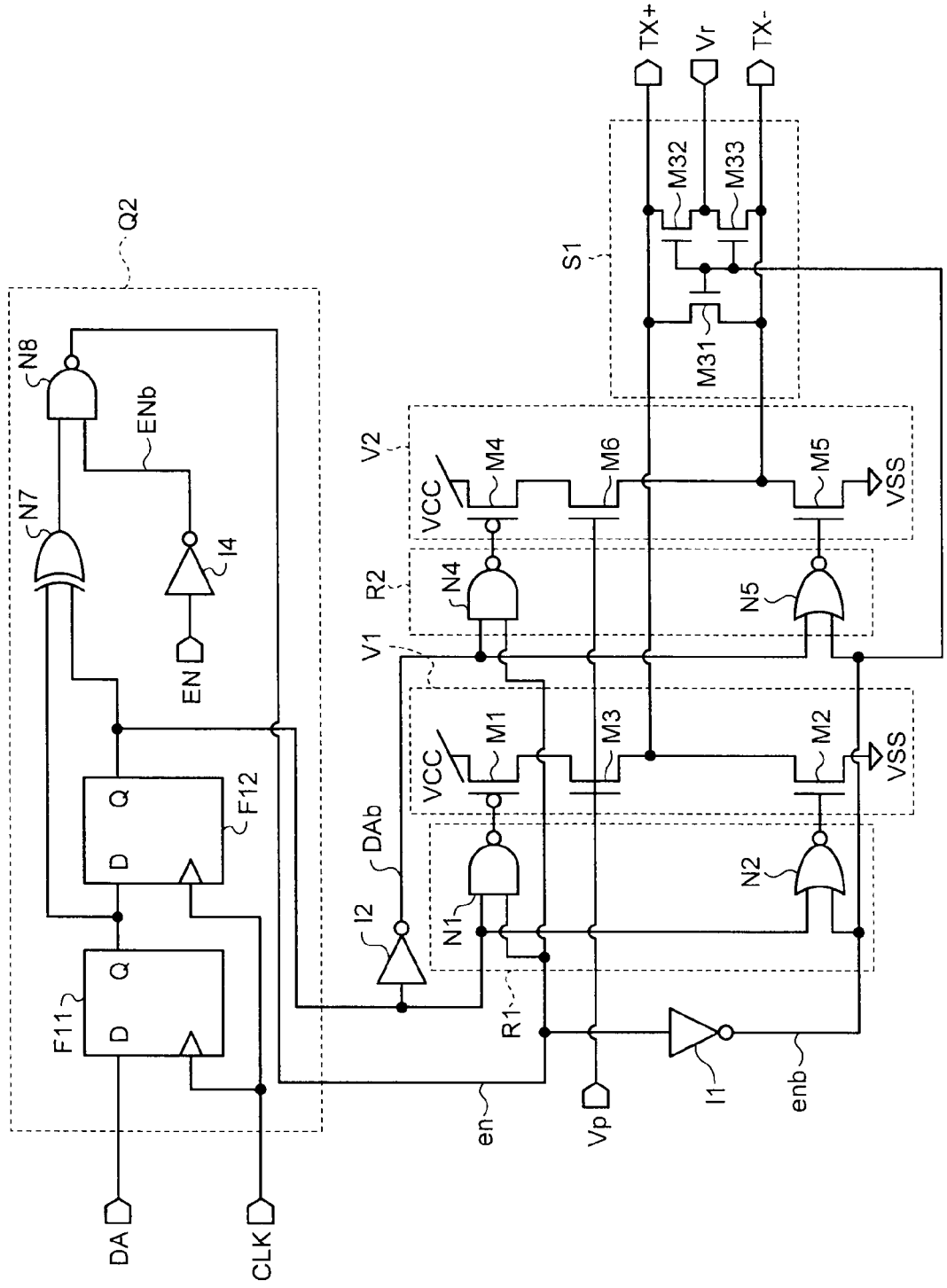
FIG. 16 is a circuit diagram showing an exemplary schematic structure of an output buffer according to a ninth embodiment.
Figure 17:
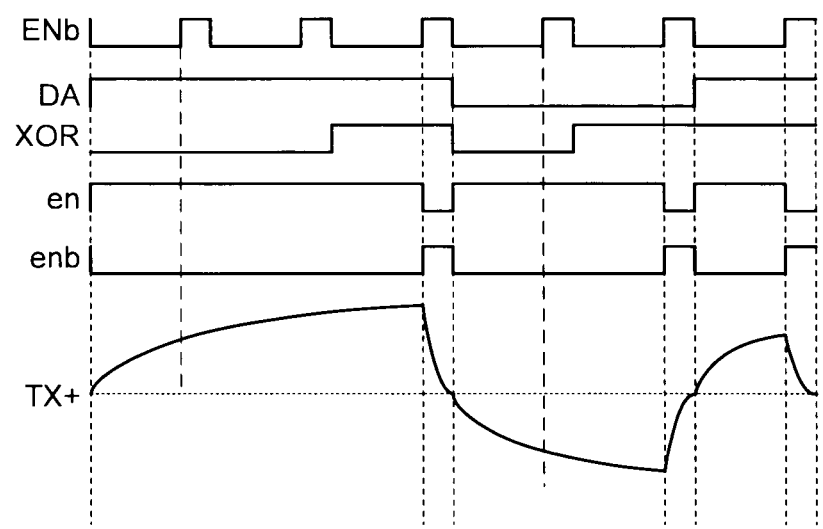
FIG. 17 is a diagram showing signal waveforms of the respective parts of the output buffer of FIG. 16.

FIG. 16 is a circuit diagram showing an exemplary schematic structure of an output buffer according to a ninth embodiment of the present invention and FIG. 17 is a diagram showing signal waveforms of the respective parts of the output buffer of FIG. 16.

In FIG. 16, the output buffer is provided with an input data deciding part Q2 in addition to the constituents of the output buffer of FIG. 13. The input data deciding part Q2 permits the data signal DA to be input into the clamp output part V1 and permits the data inversion signal DAb to be input into the clamp output part V2 only when the data signal DA changes, thereby generating an enable signal en.

The input data deciding part Q2 is provided with flip-flops F11, F12, an XOR circuit N7, a NAND circuit N8 and an inverter I4. The flip-flop F12 is connected to the rear of the flip-flop F11, an output terminal of the flip-flop F11 is connected to one input terminal of the XOR circuit N7 and an output terminal of the flip-flop F12 is connected to the other input terminal of the XOR circuit N7.

An output terminal of the XOR circuit N7 is connected to one input terminal of the NAND circuit N8 and an output terminal of the inverter I4 is connected to the other input terminal of the NAND circuit N8. The enable signal EN is input into the inverter I4.

The data signal DA two clocks before is input into one input terminal of the NAND circuit N1 and the enable signal en is input into the other input terminal of the NAND circuit N1. The data signal DA two clocks before is input into one input terminal of the NOR circuit N2 and an enable inversion signal enb which is inverted from the enable signal en is input into the other input terminal of the NOR circuit N2. The data inversion signal DAb which is inverted from the data signal DA two clocks before is input into one input terminal of the NAND circuit N4 and the enable signal en is input into the other input terminal of the NAND circuit N4. The data inversion signal DAb is input into one input terminal of the NOR circuit N5 and the enable inversion signal enb is input into the other input terminal of the NOR circuit N5.

The data signal DA is sequentially held in the flip-flops F11 and F12 according to the clock signal CLK so that the data signal DA one clock before is output from the flip-flop F11 and the data signal DA two clocks before is output from the flip-flop F12. The data signal DA one clock before is compared with the data signal DA two clocks before in the XOR circuit N7 so that a decision is made as to whether the data signal DA has changed, and the decision result is output to one input terminal of the NAND circuit N8.

The enable signal EN is inverted in the inverter I4 to generate the enable inversion signal ENb, which is output to the other input terminal of the NAND circuit N8. Then, NAND by the output of the XOR circuit N7 and the enable inversion signal ENb is operated in the NAND circuit N8 to generate the enable signal en. The enable signal en is inverted in the inverter I1 to generate the enable inversion signal ENb.

Then, NAND by the data signal DA and the enable signal en is operated in the NAND circuit N1 and the operation result is input into the gate of the P-channel field effect transistor M1. NOR by the data signal DA and the enable inversion signal enb is operated in the NOR circuit N2 and the operation result is input into the gate of the N-channel field effect transistor M2.

NAND by the data inversion signal DAb and the enable signal en is operated in the NAND circuit N4 and the operation result is input into the gate of the P-channel field effect transistor M4. NOR by the data inversion signal DAb and the enable inversion signal enb is operated in the NOR circuit N5 and the operation result is input into the gate of the N-channel field effect transistor M5.

When the enable signal en is at a low level, the data signal DA and the data inversion signal DAb are prohibited from being input into the clamp output parts V1 and V2 and the operations of the clamp output parts V1 and V2 are stopped. The N-channel field effect transistors M31 to M33 are powered on and the precharge signal Vr is supplied while the drains of the N-channel field effect transistors M2 and M5 are short-circuited, so that the output levels of the clamp output parts V1 and V2 are averaged.

When the enable signal en enters high level, the N-channel field effect transistors M31 to M33 are powered off and the clamp output parts V1 and V2 operate in a complementary manner so that the output signals TX+ and TX− differentiated according to the data signal DA are output.

The output levels of the clamp output parts V1 and V2 are averaged before the enable signal en enters high level, so that the output signals TX+ and TX− can start transiting from a middle value between the output levels of the clamp output parts V1 and V2.

The enable signal en and the enable inversion signal enb are used to operate the data input parts R1 and R2 so that the P-channel field effect transistors M1, M4 and the N-channel field effect transistors M2, M5 can be powered on/off according to the data signal DA and the data inversion signal DAb only when the data signal DA changes.

Therefore, also when the high potential VCC and the low potential VSS are supplied as the power supply voltages of the clamp output parts V1 and V2, the output signals TX+ and TX− are differentiated while the amplitudes of the output signals TX+ and TX− can be reduced, and the output signals TX+ and TX− cannot transit when the data signal DA does not change, thereby obtaining noise resistance and achieving power saving of the output buffer.

The way the input data deciding part Q2 and the output equalizing circuit S1 are added to the constituents of the output buffer of FIG. 5 is described in the embodiment of FIG. 16 but the input data deciding part Q2 and the output equalizing circuit S1 may be added to the constituents of the output buffer of FIG. 8. The way the data input parts R1 and R2 are provided in the output buffer is described in the embodiment of FIG. 16 but the data input parts R1 and R2 may be omitted similar to the structure of FIG. 10. The way the clamp output parts V1 and V2 are provided in the output buffer is described in the embodiment of FIG. 16 but the CMOS inverters V21 and V22 may be provided instead of the clamp output parts V1 and V2 as shown in FIG. 15.

Tenth Embodiment

Figure 18:
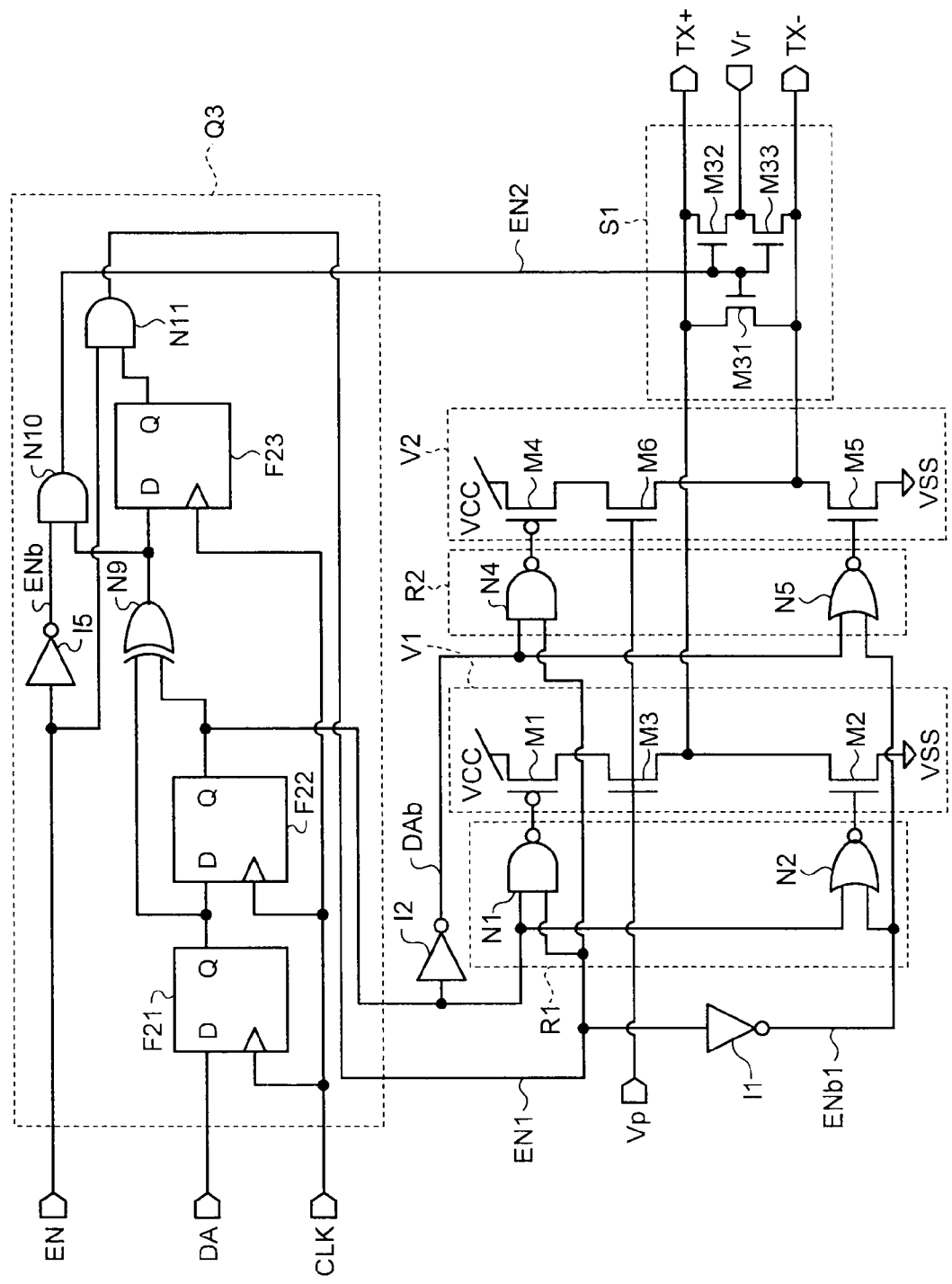
FIG. 18 is a circuit diagram showing an exemplary schematic structure of an output buffer according to a tenth embodiment.
Figure 19:
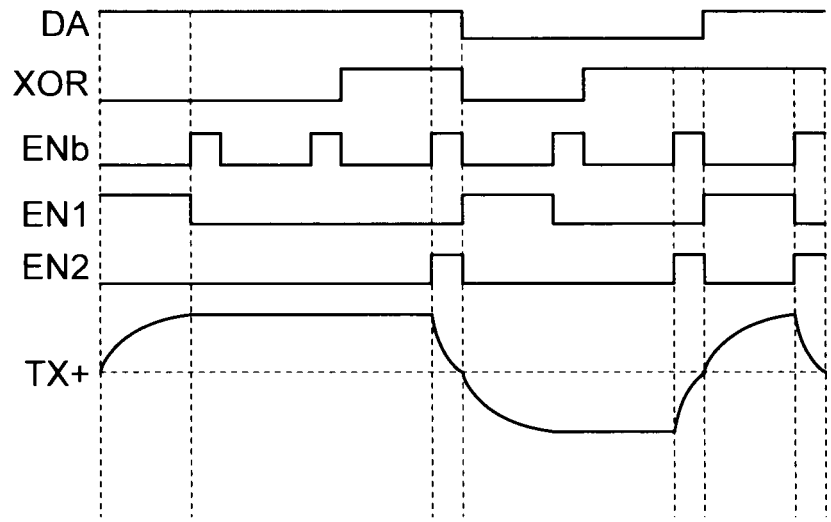
FIG. 19 is a diagram showing signal waveforms of the respective parts of the output buffer of FIG. 18.

FIG. 18 is a circuit diagram showing one exemplary schematic structure of an output buffer according to a tenth embodiment of the present invention and FIG. 19 is a diagram showing signal waveforms of the respective parts of the output buffer of FIG. 18.

In FIG. 18, the output buffer is provided with an input data deciding part Q3 instead of the input data deciding part Q2 of the output buffer of FIG. 16. The input data deciding part Q3 permits the data signal DA to be input into the clamp output part V1 and permits the data inversion signal DAb to be input into the clamp output part V2 only during one cycle of period when the data signal DA changes, thereby generating enable signals EN1 and EN2.

The input data deciding part Q3 is provided with flip-flops F21 to F23, an XOR circuit N9, AND circuits N10, N11 and an inverter I5. The flip-flop F22 is connected to the rear of the flip-flop F21, an output terminal of the flip-flop F21 is connected to one input terminal of the XOR circuit N9, an output terminal of the flip-flop F22 is connected to the other input terminal of the XOR circuit N9, and an output terminal of the XOR circuit N9 is connected to an input terminal of the flip-flop F23.

The enable inversion signal ENb is input into one input terminal of the AND circuit N10 and an output of the XOR circuit N9 is input into the other input terminal of the AND circuit N10. The enable signal EN is input into one input terminal of the AND circuit N11 and an output of the flip-flop F23 is input into the other input terminal of the AND circuit N11. The enable signal EN is input into the inverter I5.

The data signal DA two clocks before is input into one input terminal of the NAND circuit N1 and the enable signal EN1 is input into the other input terminal of the NAND circuit N1. The data signal DA two clocks before is input into one input terminal of the NOR circuit N2 and an enable inversion signal ENb1 which is inverted from the enable signal EN1 is input into the other input terminal of the NOR circuit N2. The data inversion signal DAb which is inverted from the data signal DA two clocks before is input into one input terminal of the NAND circuit N4 and the enable signal EN1 is input into the other input terminal of the NAND circuit N4. The data inversion signal DAb is input into one input terminal of the NOR circuit N5 and the enable inversion signal ENb1 is input into the other input terminal of the NOR circuit N5.

The data signal DA is sequentially held in the flip-flops F21 and F22 according to the clock signal CLK so that the data signal DA one clock before is output from the flip-flop F21 and the data signal DA two clocks before is output from the flip-flop F22. The data signal DA one clock before is compared with the data signal DA two clocks before in the XOR circuit N9 so that a decision is made as to whether the data signal DA has changed, and the decision result is output to one input terminal of the AND circuit N10 and is output to the input terminal of the flip-flop F23.

The enable signal EN is inverted in the inverter I5 to generate the enable inversion signal ENb, which is output to the other input terminal of the AND circuit N10. AND by the output of the XOR circuit N9 and the enable inversion signal ENb is operated in the AND circuit N10 to generate the enable signal EN2.

The output of the XOR circuit N9 is held in the flip-flop F23. AND by the output of the flip-flop F23 and the enable signal EN is operated in the AND circuit N11 to generate the enable signal EN1. The enable signal EN1 is inverted in the inverter I1 to generate an enable inversion signal EN1b.

Then, NAND by the data signal DA and the enable signal EN1 is operated in the NAND circuit N1 and the operation result is input into the gate of the P-channel field effect transistor M1. NOR by the data signal DA and the enable inversion signal ENb1 is operated in the NOR circuit N2 and the operation result is input into the gate of the N-channel field effect transistor M2.

NAND by the data inversion signal DAb and the enable signal EN1 is operated in the NAND circuit N4 and the operation result is input into the gate of the P-channel field effect transistor M4. NOR by the data inversion signal DAb and the enable inversion signal ENb1 is operated in the NOR circuit N5 and the operation result is input into the gate of the N-channel field effect transistor M5.

When the enable signal EN1 is at a low level, the data signal DA and the data inversion signal DAb are prohibited from being input into the clamp output parts V1 and V2 and the operations of the clamp output parts V1 and V2 are stopped. When the enable signal EN2 is at a high level, the N-channel field effect transistors M31 to M33 are powered on and the precharge signal Vr is supplied while the drains of the N-channel field effect transistors M2 and M5 are short-circuited, so that the output levels of the clamp output parts V1 and V2 are averaged.

When the enable signal EN2 enters low level, the N-channel field effect transistors M31 to M33 are powered off. When the enable signal EN1 enters high level in this cycle, the clamp output parts V1 and V2 operate in a complementary manner and the output signals TX+ and TX− differentiated according to the data signal DA are output. Then, when the enable signal EN1 transits to low level in the next cycle and the data signal DA and the data inversion signal DAb are prohibited from being input into the clamp output parts V1 and V2 so that the levels of the output signals TX+ and TX− remain constant.

The enable signal EN1 enters high level only during one cycle of period when the data signal DA changes so that the data signal DA and the data inversion signal DAb can be prevented from being continuously input into the clamp output parts V1 and V2 also when the data signal DA does not change for several cycles. The amplitudes of the output signals TX+ and TX− due to a change in the data signal DA can be reduced and power saving of the output buffer can be achieved.

The way the input data deciding part Q3 and the output equalizing circuit S1 are added to the constituents of the output buffer of FIG. 5 is described in the embodiment of FIG. 18 but the input data deciding part Q3 and the output equalizing circuit S1 may be added to the constituents of the output buffer of FIG. 8. The way the data input parts R1 and R2 are provided in the output buffer is described in the embodiment of FIG. 18 but the data input part R1 and R2 may be omitted similar to the structure of FIG. 10. The way the clamp output parts V1 and V2 are provided in the output buffer is described in the embodiment of FIG. 18 but the CMOS inverters V21 and V22 may be provided instead of the clamp output parts V1 and V2 as shown in FIG. 15.

Figure 20:
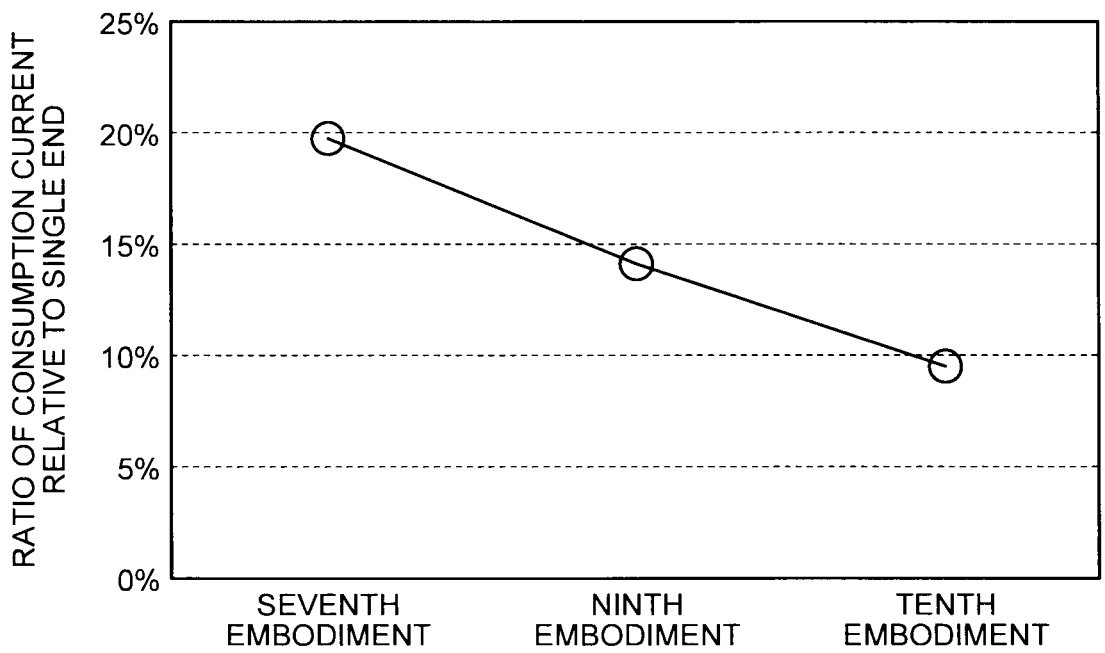
FIG. 20 is a diagram showing consumption currents of the seventh, ninth and tenth embodiments in comparison with a single end structure.

FIG. 20 is a diagram showing consumption currents of the seventh, ninth and tenth embodiments in comparison with a single end structure.

In FIG. 20, the consumption current can be reduced to about 20% relative to the single end structure in the seventh embodiment, the consumption current can be reduced to about 15% relative to the single end structure in the ninth embodiment, and the consumption current can be reduced to about 10% relative to the single end structure in the tenth embodiment.

Eleventh Embodiment

Figure 21:
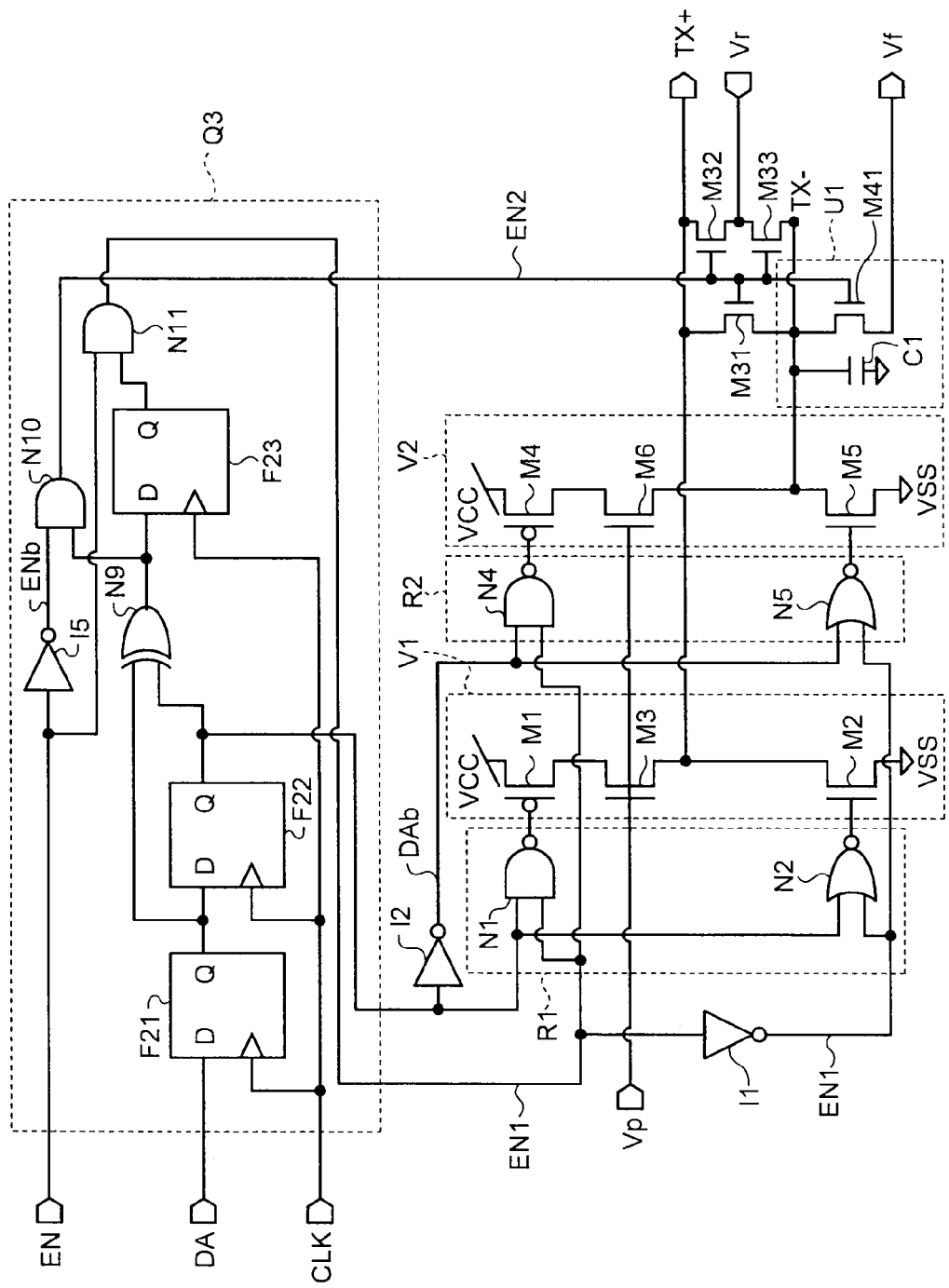
FIG. 21 is a circuit diagram showing an exemplary schematic structure of an output buffer according to an eleventh embodiment.
Figure 22:
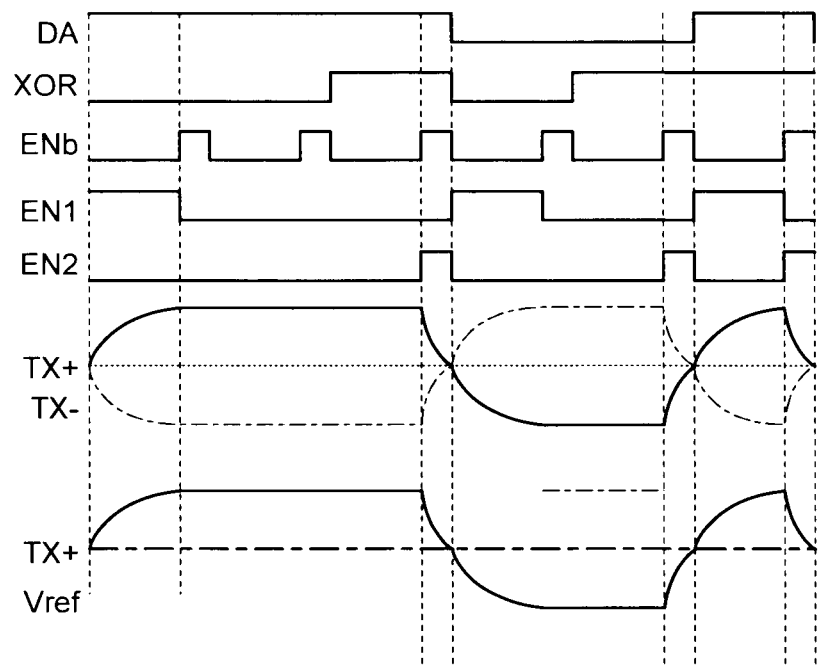
FIG. 22 is a diagram showing signal waveforms of the respective parts of the output buffer of FIG. 21.

FIG. 21 is a circuit diagram showing an exemplary schematic structure of an output buffer according to an eleventh embodiment of the present invention and FIG. 22 is a diagram showing signal waveforms of the respective parts of the output buffer of FIG. 21.

In FIG. 21, the output buffer is provided with a reference voltage setting part U1 in addition to the constituents of the output buffer of FIG. 18. The reference voltage setting part U1 can fix the output level of the clamp output part V2 at a reference voltage Vf.

The reference voltage setting part U1 is provided with an N-channel field effect transistor M41 and a capacitor C1. One end of the capacitor C1 is connected to the drain of the N-channel field effect transistor M5. A drain of the N-channel field effect transistor M41 is connected to the drain of the N-channel field effect transistor M5 and a gate of the N-channel field effect transistor M41 is connected to the output terminal of the AND circuit N10. The reference voltage Vf is supplied to a source of the N-channel field effect transistor M41.

When the enable signal EN2 enters high level, the N-channel field effect transistor M41 is powered on, the output signal TX− is fixed at the reference voltage Vf and the output signal TX+ is defined with reference to the reference voltage Vf.

Thus, the output terminal configured to output the output signal TX− can be eliminated and the number of output terminals can be reduced.

The way the output signal TX− is fixed at the reference voltage Vf is described in the embodiment of FIG. 21 but the output signal TX+ may be fixed at the reference voltage Vf. The way the input data deciding part Q3 and the output equalizing circuit S1 are added to the constituents of the output buffer of FIG. 5 is described in the embodiment of FIG. 21 but the input data deciding part Q3 and the output equalizing circuit S1 may be added to the constituents of the output buffer of FIG. 8. The way the data input parts R1 and R2 are provided in the output buffer is described in the embodiment of FIG. 21 but the data input parts R1 and R2 may be omitted similar to the structure of FIG. 10. The way the clamp output parts V1 and V2 are provided in the output buffer is described in the embodiment of FIG. 21 but the CMOS inverters V21 and V22 may be provided instead of the clamp output parts V1 and V2 as shown in FIG. 15. The way the input data deciding part Q3 is provided in the output buffer is described in the embodiment of FIG. 21 but the input data deciding part Q3 may be omitted. The way the output equalizing circuit S1 is provided in the output buffer is described in the embodiment of FIG. 21 but the output equalizing circuit S1 may be omitted.

In the aforementioned embodiments, the memory chips may be stacked in order to increase the capacity per package, which can greatly contribute a request for the pads.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An output buffer comprising:
a clamp output stage comprising a first clamp output part and a second clamp output part, wherein at least one of the first clamp output part and second clamp output part is configured to clamp a drain potential of a P-channel field effect transistor or a drain potential of an N-channel field effect transistor to an intermediate potential between a high potential supplied to a source of the P-channel field effect transistor and a low potential supplied to a source of the N-channel field effect transistor by inserting a field effect transistor for potential clamp in series between the P-channel field effect transistor and the N-channel field effect transistor and inputting an intermediate level between the high potential and the low potential into a gate of the field effect transistor for potential clamp; an output equalizing circuit configured to average an output level of the first clamp output part and an output level of the second clamp output part per cycle; and
a data input part configured to be connected to the front of the clamp output stage and to input a data signal into a gate of the P-channel field effect transistor and a gate of the N-channel field effect transistor based on an enable signal during data output, wherein the data input part comprises:
a NAND circuit configured to output NAND by the data signal and the enable signal to the gate of the P-channel field effect transistor; and
a NOR circuit configured to output NOR by the data signal and an enable inversion signal which is inverted from the enable signal to the gate of the N-channel field effect transistor.

2. The output buffer according to claim 1, comprising a reference voltage setting part configured to fix a output level of the second clamp output part at a reference voltage.

3. An output buffer comprising:
a first clamp output part in which a first field effect transistor for potential clamp is inserted in series between a first P-channel field effect transistor and a first N-channel field effect transistor, an intermediate level between a high potential supplied to a source of the first P-channel field effect transistor and a low potential supplied to a source of the first N-channel field effect transistor is input into a gate of the first field effect transistor for potential clamp and a data signal is input into a gate of the first P-channel field effect transistor and a gate of the first N-channel field effect transistor; and a second clamp output part in which a second field effect transistor for potential clamp is inserted in series between a second P-channel field effect transistor and a second N-channel field effect transistor, an intermediate level between a high potential supplied to a source of the second P-channel field effect transistor and a low potential supplied to a source of the second N-channel field effect transistor is input into a gate of the second field effect transistor for potential clamp, and a data inversion signal which is inverted from the data signal is input into a gate of the second P-channel field effect transistor and a gate of the second N-channel field effect transistor.

4. The output buffer according to claim 3, wherein an output terminal is connected to a pad electrode of a semiconductor chip mounting a NAND flash memory thereon.

5. The output buffer according to claim 4, wherein a plurality of semiconductor chips are stacked and the output terminals are connected to a plurality of pad electrodes of the semiconductor chips.

6. The output buffer according to claim 3, comprising an input data deciding part configured to permit the data signal to be input into the first clamp output part and to permit the data inversion signal to be input into the second clamp output part only when the data signal changes in each data output cycle.

7. The output buffer according to claim 6, wherein the input data deciding part permits the data signal to be input into the first clamp output part and permits the data inversion signal to be input into the second clamp output part only during one cycle of period when the data signal changes.

8. An output buffer comprising:
a first clamp output part configured to clamp a drain potential of a first P-channel field effect transistor or a drain potential of a first N-channel field effect transistor by inserting a first field effect transistor for potential clamp in series between the first P-channel field effect transistor and the first N-channel field effect transistor and inputting an intermediate level between a high potential supplied to a source of the first P-channel field effect transistor and a low potential supplied to a source of the first N-channel field effect transistor into a gate of the first field effect transistor for potential clamp;

a second clamp output part configured to clamp a drain potential of a second P-channel field effect transistor or a drain potential of a second N-channel field effect transistor by inserting a second field effect transistor for potential clamp in series between the second P-channel field effect transistor and the second N-channel field effect transistor and inputting an intermediate level between a high potential supplied to a source of the second P-channel field effect transistor and a low potential supplied to a source of the second N-channel field effect transistor into a gate of the second field effect transistor for potential clamp;

a first data input part configured to be connected to the front of the first clamp output part and to input a data signal into a gate of the first P-channel field effect transistor and a gate of the first N-channel field effect transistor based on an enable signal; and a second data input part configured to be connected to the front of the second clamp output part and to input a data inversion signal which is inverted from the data signal into a gate of the second P-channel field effect transistor and a gate of the second N-channel field effect transistor based on the enable signal.

9. The output buffer according to claim 8, wherein the data input part comprises:
a first NAND circuit configured to output NAND by the data signal and the enable signal to the gate of the first P-channel field effect transistor;
a first NOR circuit configured to output NOR by the data signal and an enable inversion signal which is inverted from the enable signal to the gate of the first N-channel field effect transistor;
a second NAND circuit configured to output NAND by a data inversion signal which is inverted from the data signal and the enable signal to the gate of the second P-channel field effect transistor; and
a second NOR circuit configured to output NOR by the data inversion signal and the enable inversion signal to the gate of the second N-channel field effect transistor.

10. The output buffer according to claim 9, wherein an output terminal is connected to a pad electrode of a semiconductor chip mounting a NAND flash memory thereon.

11. The output buffer according to claim 10, wherein a plurality of semiconductor chips are stacked and the output terminals are connected to a plurality of pad electrodes of the semiconductor chips.

12. The output buffer according to claim 9, comprising an input data deciding part configured to permit the data signal to be input into the first clamp output part and to permit the data inversion signal to be input into the second clamp output part only when the data signal changes in each data output cycle.

13. The output buffer according to claim 12, wherein the input data deciding part permits the data signal to be input into the first clamp output part and permits the data inversion signal to be input into the second clamp output part only during one cycle of period when the data signal changes.

14. The output buffer according to claim 9, comprising an output equalizing circuit configured to average an output level of the first clamp output part and an output level of the second clamp output part per cycle.

* * * * *